US007470949B1

(12) United States Patent
Chen et al.

(10) Patent No.: US 7,470,949 B1
(45) Date of Patent: Dec. 30, 2008

(54) BIDIRECTIONAL NONVOLATILE MEMORY CELL HAVING CHARGE TRAPPING LAYER IN TRENCH AND AN ARRAY OF SUCH MEMORY CELLS, AND METHOD OF MANUFACTURING

(75) Inventors: Bomy Chen, Cupertino, CA (US); Yuniarto Widjaja, San Jose, CA (US); Jack Edward Frayer, Boulder Creek, CA (US); Felix (Ying-Kit) Tsui, Cupertino, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 40 days.

(21) Appl. No.: 11/828,213

(22) Filed: Jul. 25, 2007

(51) Int. Cl.
*H01L 27/108* (2006.01)

(52) U.S. Cl. .................. 257/314; 257/315; 257/316; 257/320; 257/321; 257/E21.68

(58) Field of Classification Search ............. 257/314, 257/315, 316, 320, 321, E21.68
See application file for complete search history.

(56) References Cited

U.S. PATENT DOCUMENTS 6,861,315 B1   3/2005  Chen 6,936,883 B2   8/2005  Chen
6,940,125 B2   9/2005  Kianian

OTHER PUBLICATIONS

Choi, et al., "High Density Silicon Nanocrystal Embedded in SiN Prepared by Low Energy (<500eV) $SiH_4$ Plasma Immersion Ion Implantation for Non-volatile Memory Applications," IEEE, 2005, 4 pages.

*Primary Examiner*—Evan Pert
*Assistant Examiner*—Tan N Tran
(74) *Attorney, Agent, or Firm*—DLA Piper LLP (US)

(57) ABSTRACT

A nonvolatile memory cell has a charge trapping layer for the storage of charges thereon. The cell is a bidirectional cell in a substrate of a first conductivity. The cell has two spaced apart trenches. Within each trench, at the bottom thereof is a region of a second conductivity. A channel extends from one of the region at the bottom of one of the trenches along the side wall of that trench to the top planar surface of the substrate, and along the sidewall of the adjacent trench to the region at the bottom of the adjacent trench. The trapping layer is along the sidewall of each of the two trenches. A control gate is in each of the trenches capacitively coupled to the trapping layer along the sidewall and to the region at the bottom of the trench. Each of the trenches can stored a plurality of bits.

14 Claims, 28 Drawing Sheets

US 7,470,949 B1

BIDIRECTIONAL NONVOLATILE MEMORY CELL HAVING CHARGE TRAPPING LAYER IN TRENCH AND AN ARRAY OF SUCH MEMORY CELLS, AND METHOD OF MANUFACTURING

TECHNICAL FIELD

The present invention relates to a bidirectional nonvolatile memory cell having a charge trapping layer in a trench, and an array of such cells, and a method of manufacturing, and more particularly, wherein the cell can store multi-bits.

BACKGROUND OF THE INVENTION

Nonvolatile memory cells having a charge trapping layer to store charges is well known in the art. See for example, U.S. Pat. No. 6,940,125 assigned to the present assignee, whose disclosure is incorporated by reference in its entirety herein. Bi-directional cells made from trenches in a substrate are also well known in the art. See U.S. Pat. Nos. 6,940,125 6,861,315 and 6,936,883. Finally, the use of silicon nanocrystals (Si-nc) embedded in SiN as a charge trapping layer is also well known in the art. See Choi S., et al. "High Density Silicon Nanocrystal Embedded in SiN Prepared by Low Energy (<500 eV) $SiH_4$ plasma Immersion Ion Implantation for Nonvolatile Memory Applications" IEDM August, 2005.

It is an object of the present invention to provide a bi-directional non-volatile memory cell (as well as an array and a method of making the array) using a charge trapping layer to store multi-bits in each cell.

SUMMARY OF THE INVENTION

Accordingly, in the present invention, a non-volatile memory cell comprises a substrate of a substantially single crystalline semiconductive material having a first conductivity type and a planar surface. A first trench is in the substrate extending in a first direction. The first trench has a sidewall and a bottom. A first region of a second conductivity type is in the bottom of the first trench. A second trench is in the substrate extending in the first direction parallel to and spaced apart from the first trench by a section along the planar surface. The second trench also has a sidewall and a bottom. A second region of the second conductivity type is in the bottom of the second trench. A channel region connects the first and second regions for the conduction of charges. The channel region has three portions: a first portion along the sidewall of the first trench, a second portion along the sidewall of the second trench; and a third portion along the section between the first and second trenches, near the planar surface. A first charge trapping layer is spaced apart from the first portion of the channel region and is for trapping charges. A second charge trapping layer is spaced apart from the second portion of the channel region and is for trapping charges. A dielectric layer is spaced apart from the third portion of the channel region. A first control gate is in the first trench extending in the first direction, capacitively coupled to the first charge trapping layer and to the first region. A second control gate is in the second trench extending in the first direction, capacitively coupled to the second charge trapping layer and to the second region. A third control gate is coupled to the dielectric layer for controlling the conduction of charges in the third portion of the channel region.

The present invention also relates to an array of the foregoing described nonvolatile memory cells. Finally, the present invention relates to a method of manufacturing an array of nonvolatile memory cells.

BRIEF DESCRIPTION OF THE DRAWINGS

FIGS. 4A-1 through 4Z-1 are cross sectional views of the steps showing a method of manufacturing a memory array of the present invention, with FIGS. 4A-2 through 4Z-2 showing cross sectional views of the corresponding portion of the periphery of the memory array.

DETAILED DESCRIPTION OF THE INVENTION

Figure 1:
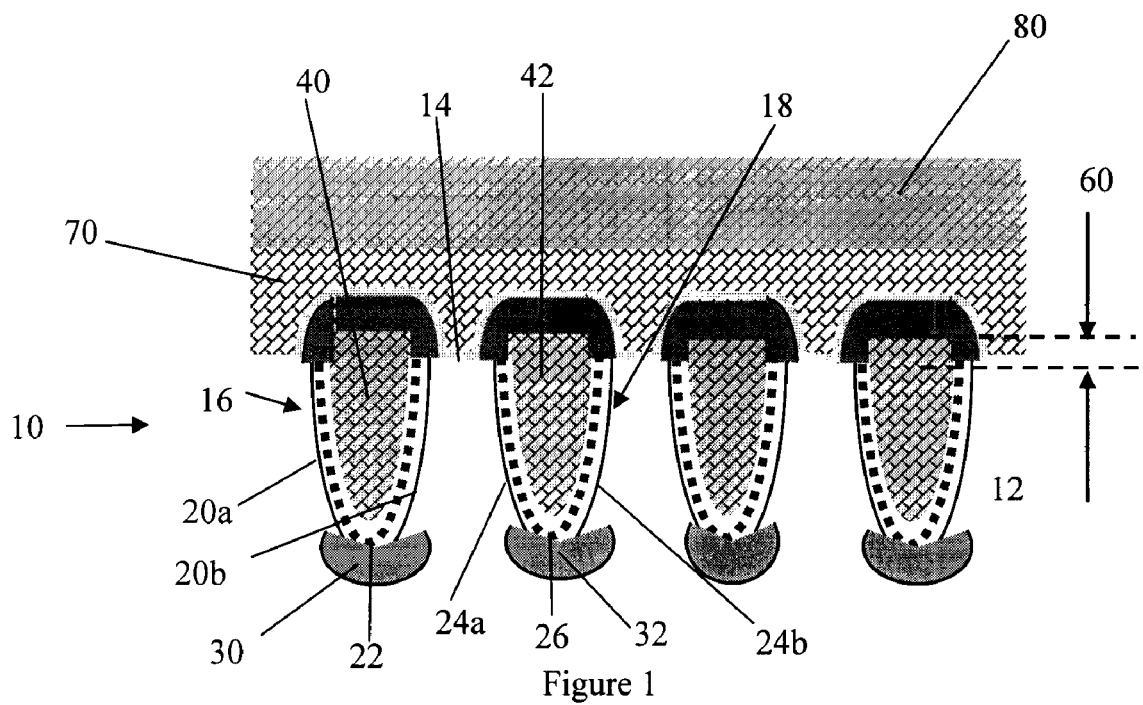
FIG. 1 is a cross-sectional view of a first embodiment of a nonvolatile memory cell of the present invention.

Referring to FIG. 1, there is shown a cross-sectional view of a first embodiment of a nonvolatile memory cell 10 of the present invention.

The cell 10 comprises a substantially single crystalline semiconductor substrate 12, having a planar surface 14. The substrate 12 is of a first conductivity type, such as P type. A first trench 16 and a second trench 18 are formed in the substrate 12 with each of the trenches 16 and 18 being formed substantially perpendicular to the surface 14. The trench 16 has a first sidewall 20a, and a second sidewall 20b and a bottom 22. The trench 18 has a first sidewall 24a and a second sidewall 24b and a bottom 26. A region 30 of a second conductivity type, such as N, is at the bottom 22 of the first trench 16. A region 32 of the second conductivity type, such as N, is at the bottom 26 of the second trench 18. A channel connects the region 30 to the region 32, and consists of three parts: along the second sidewall 20b of the first trench 16, along the planar surface 14 separating the first trench 16 from the second trench 18, and along the first sidewall 24a of the second trench 18.

Figures 2, 4A:
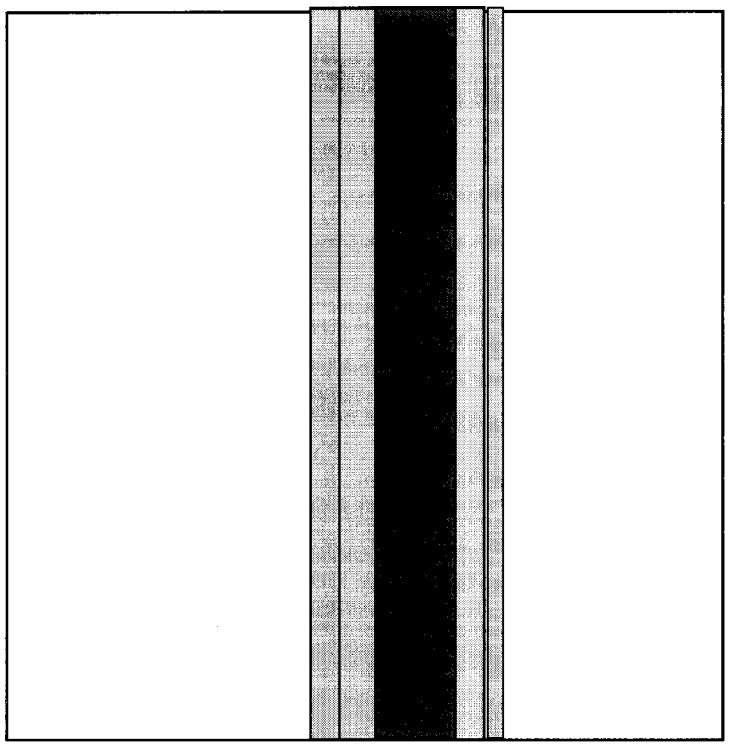
Figures 1, 4A:
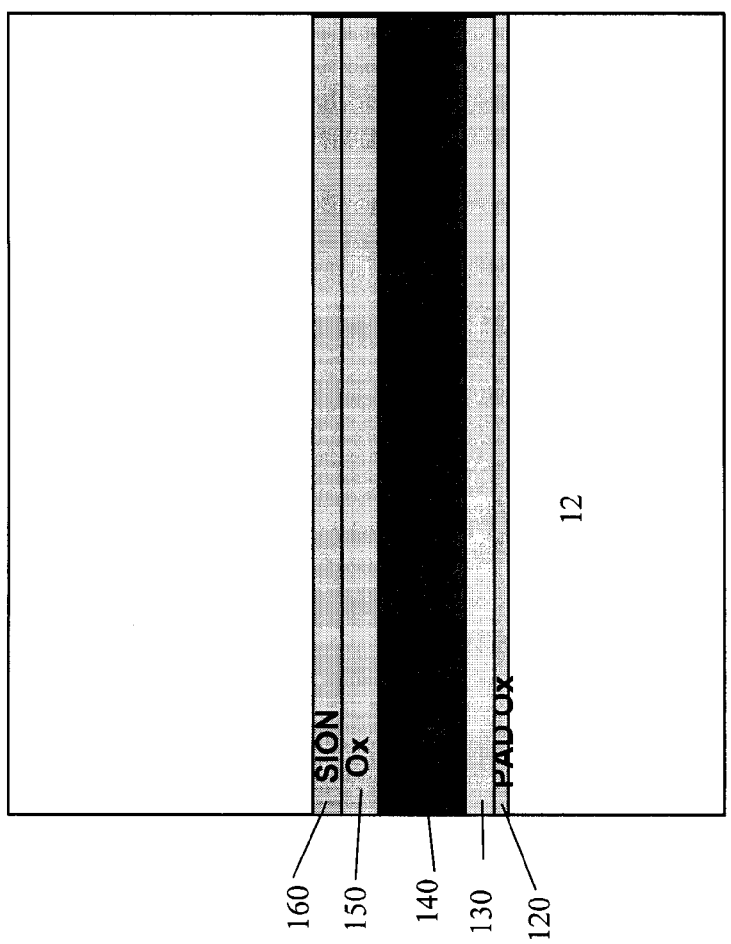
Figures 2, 4B:
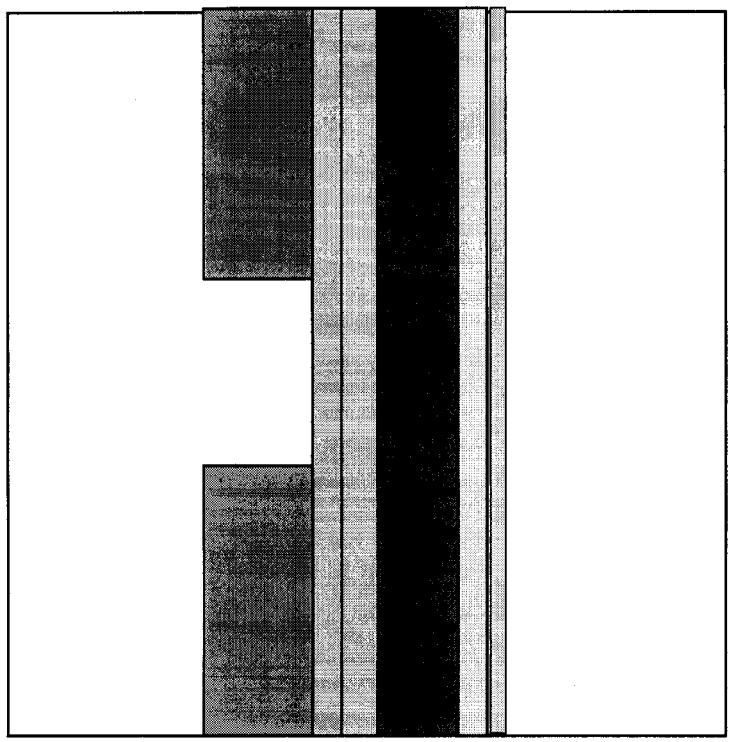
Figures 1, 4B:
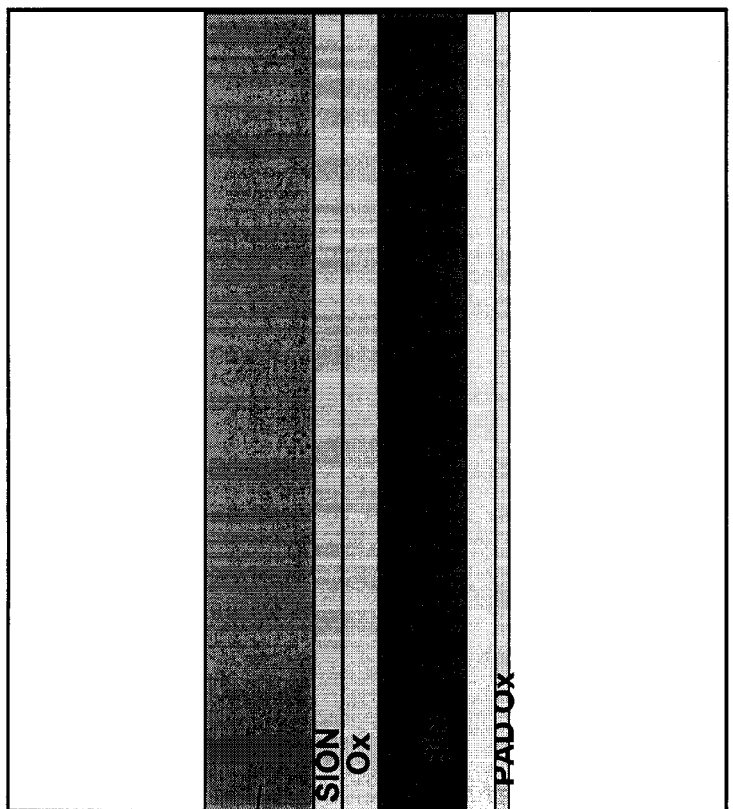
Figures 2, 4C:
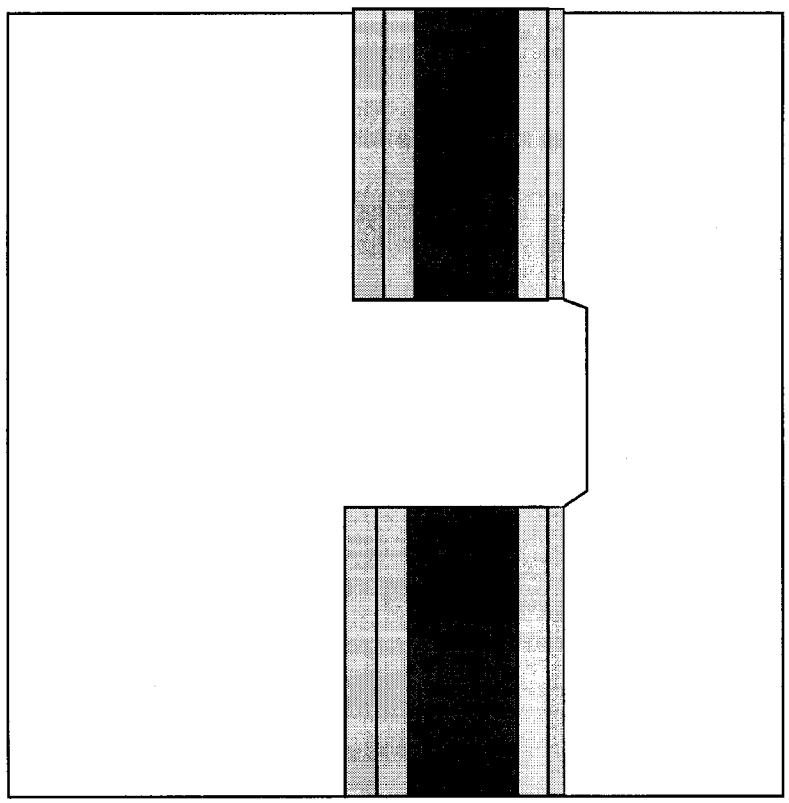
Figures 1, 4C:
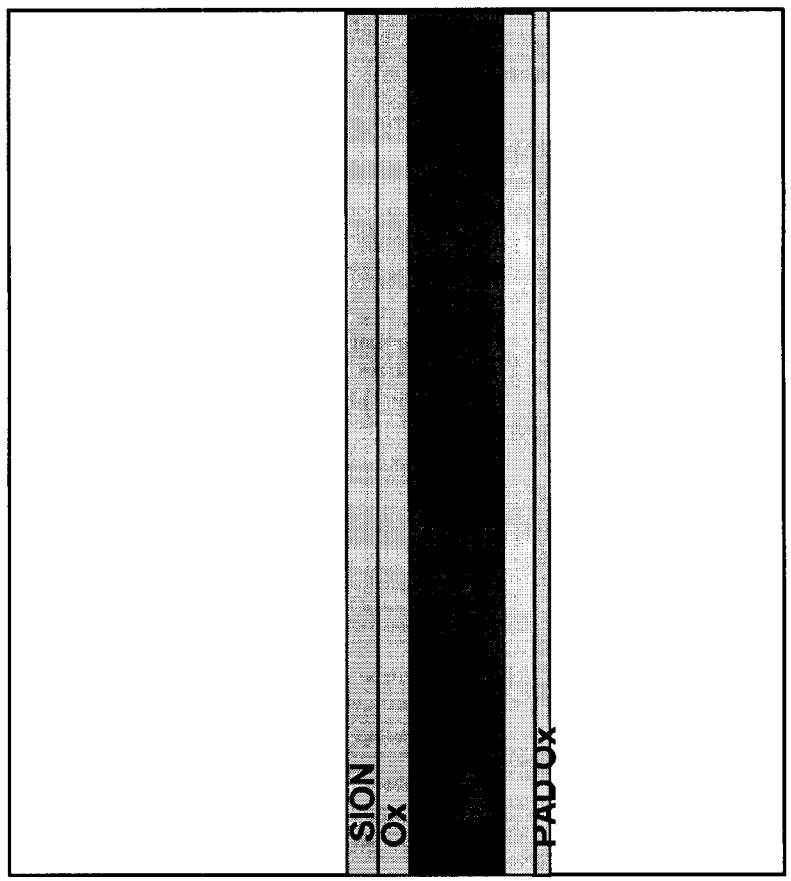
Figures 2, 4D:
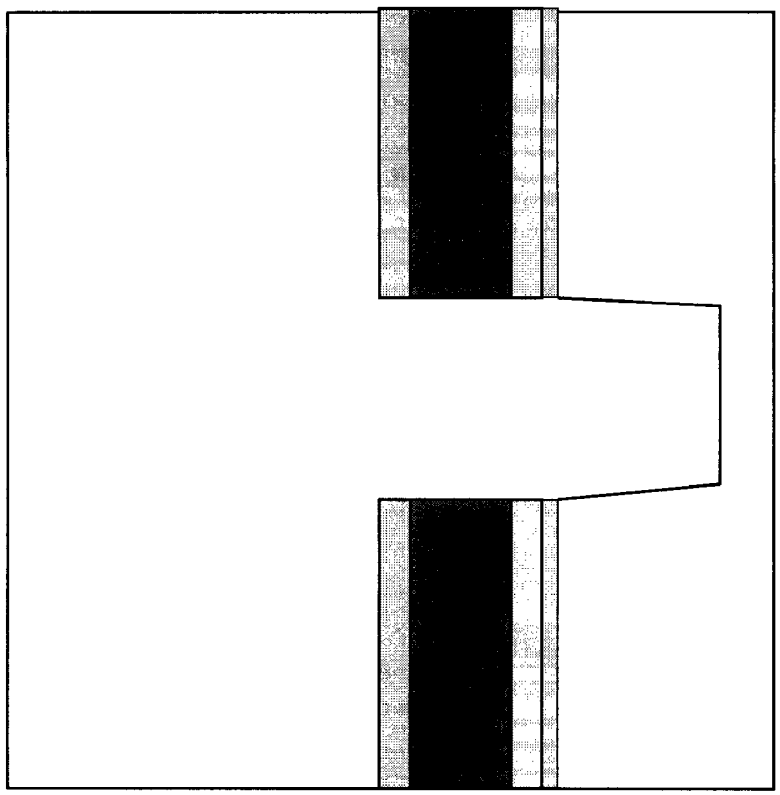
Figures 1, 4D:
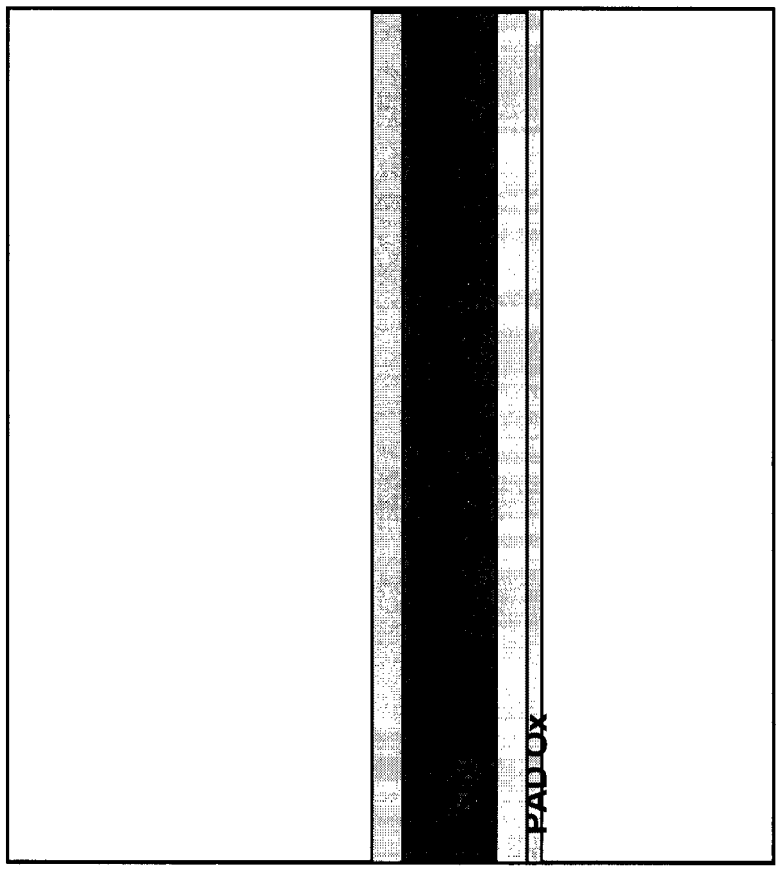
Figures 2, 4E:
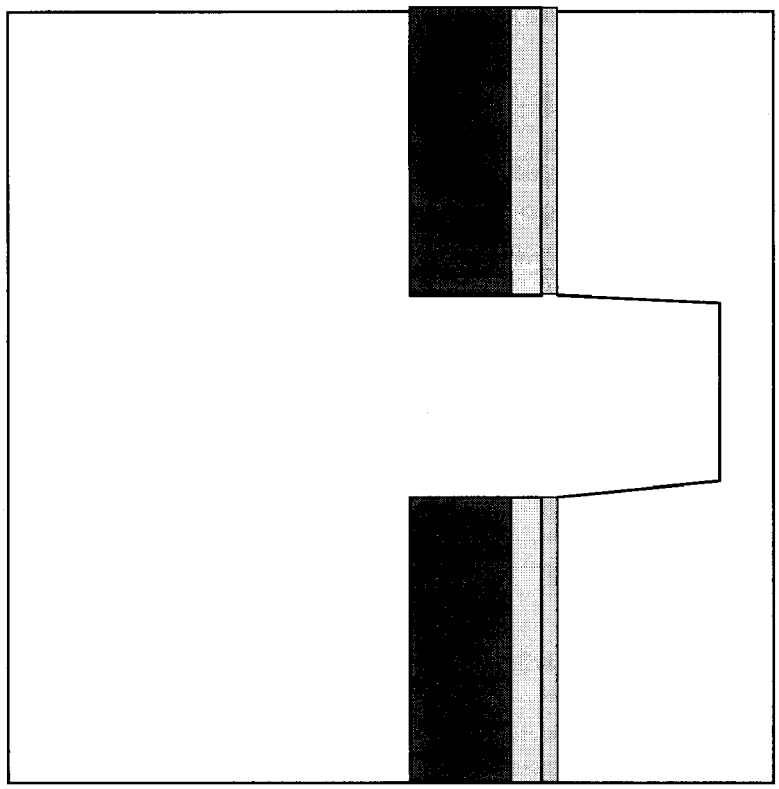
Figures 1, 4E:
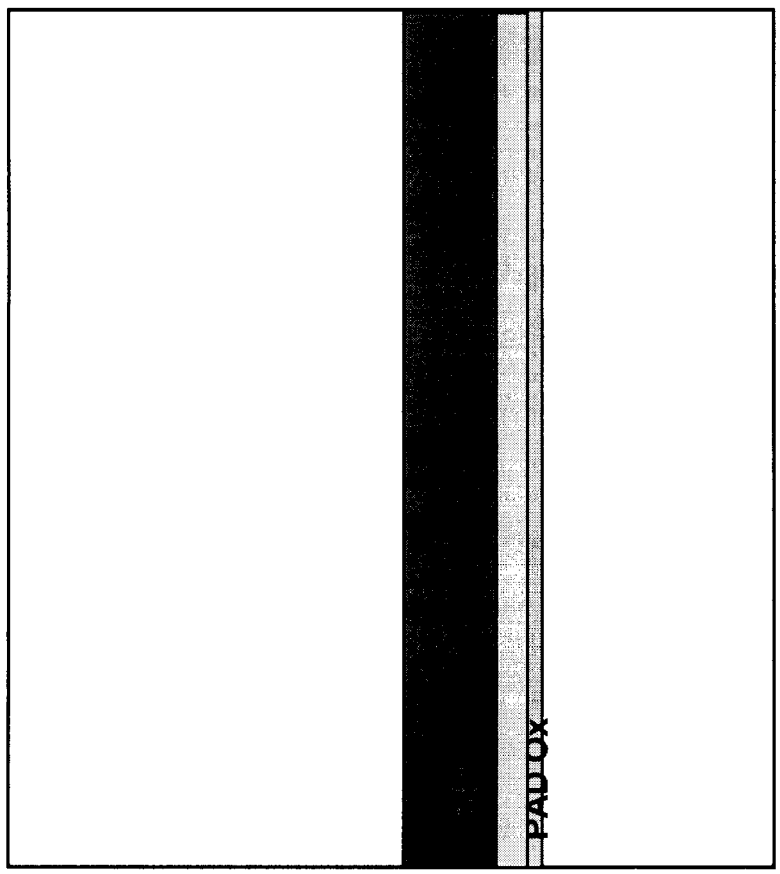
Figures 2, 4F:
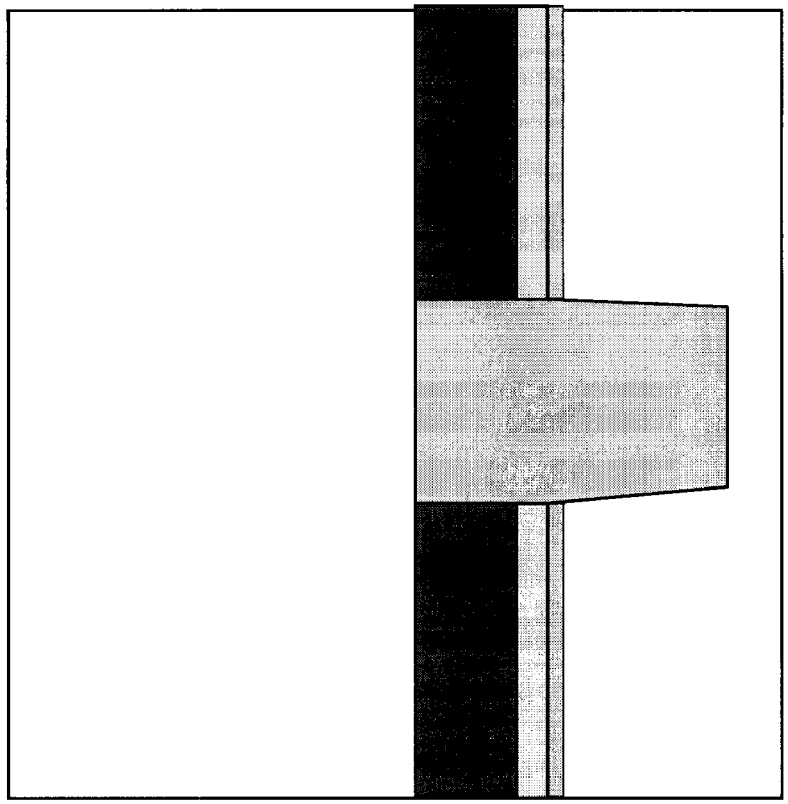
Figures 1, 4F:
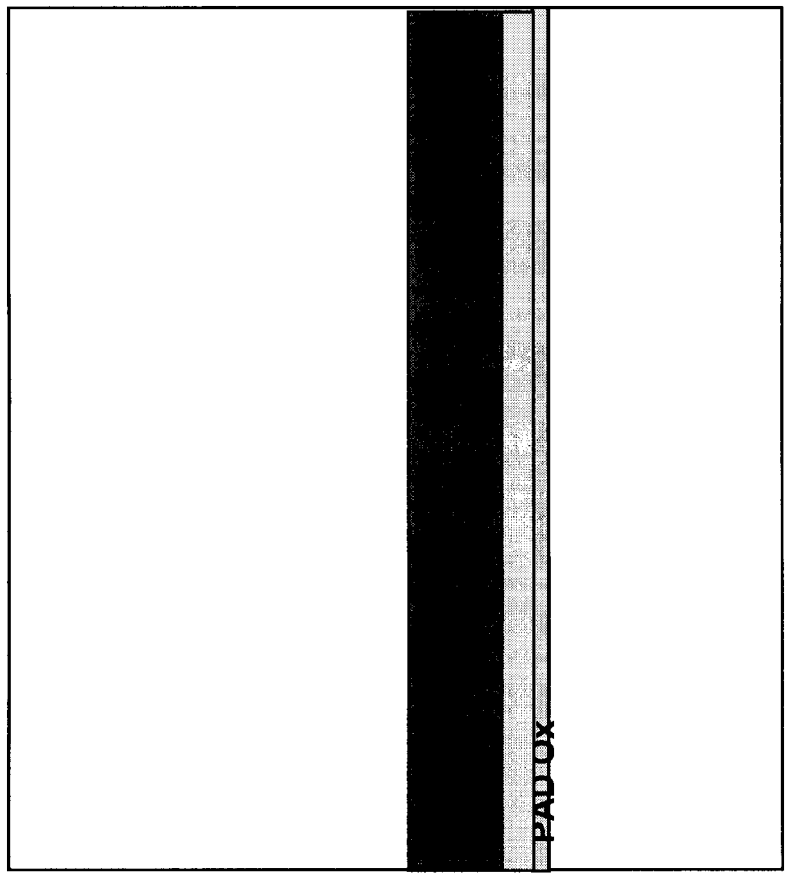
Figures 2, 4G:
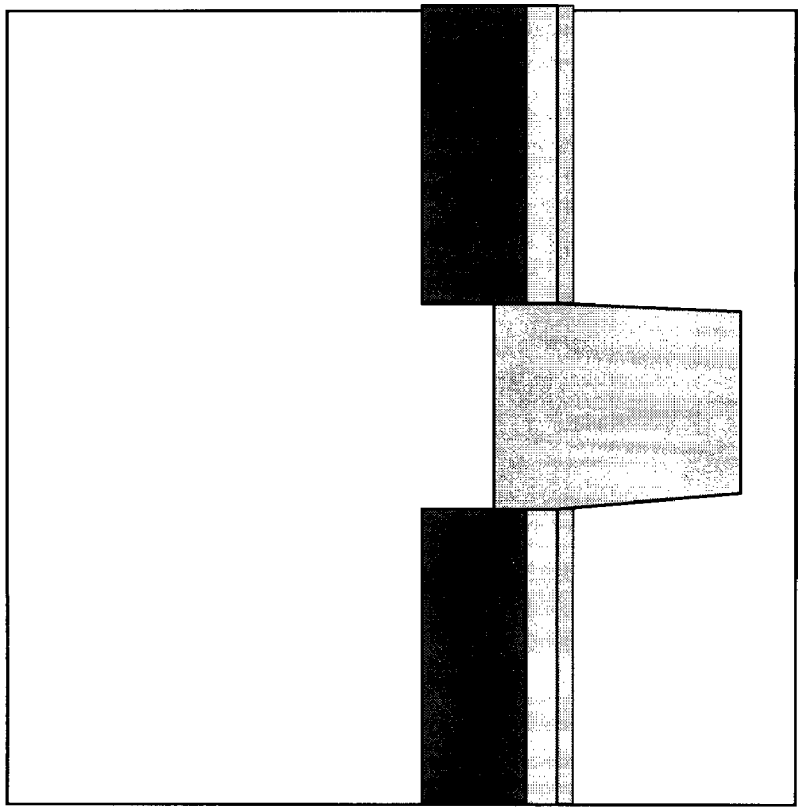
Figures 1, 4G:
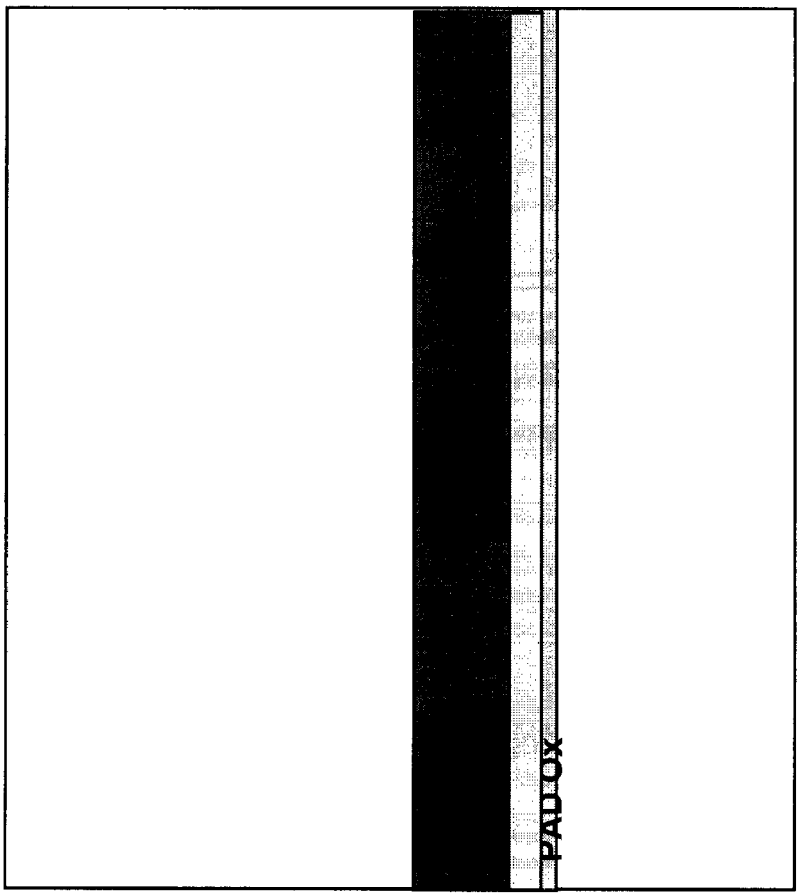
Figures 2, 4H:
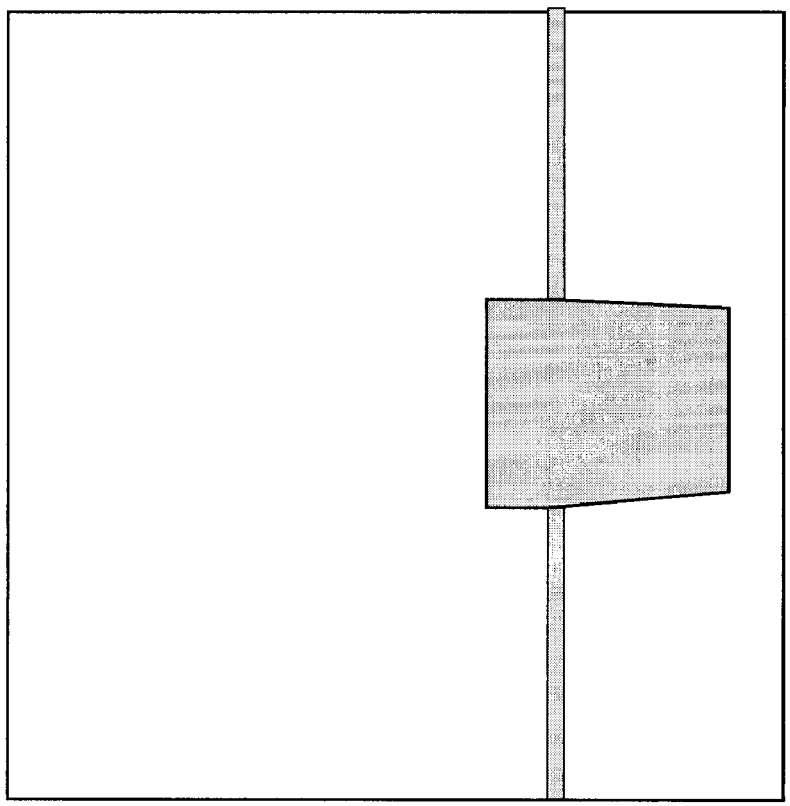
Figures 1, 4H:
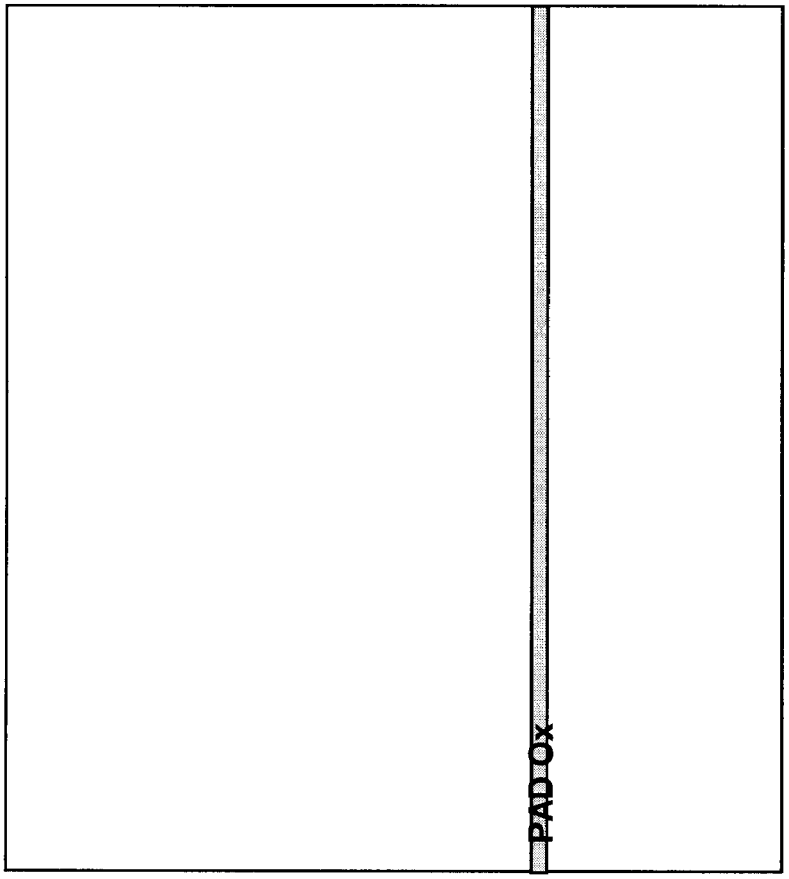
Figures 2, 4I:
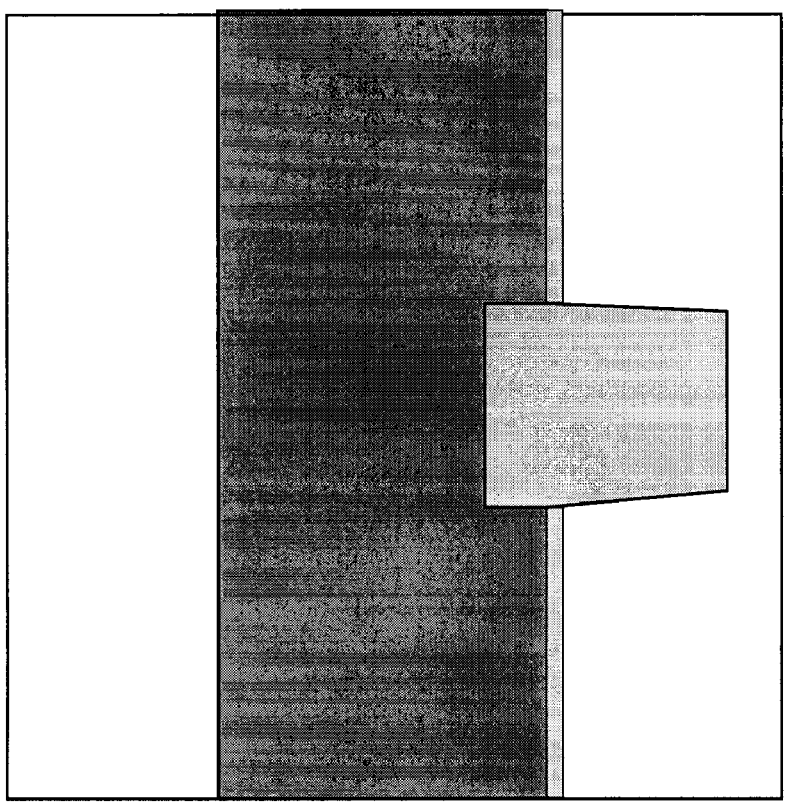
Figures 1, 4I:
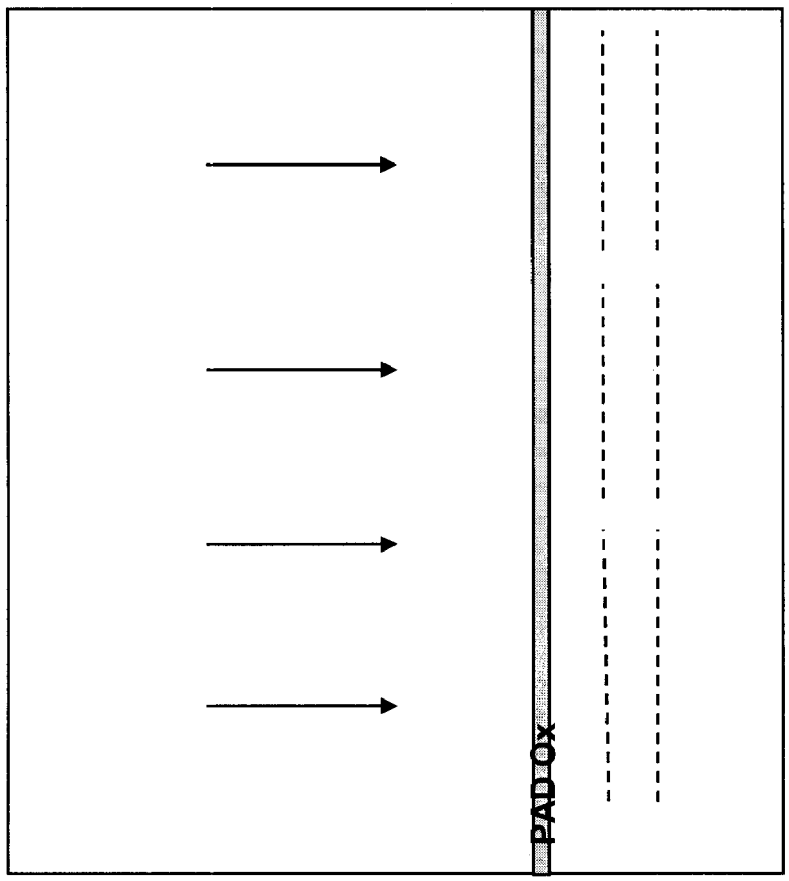
Figures 2, 4J:
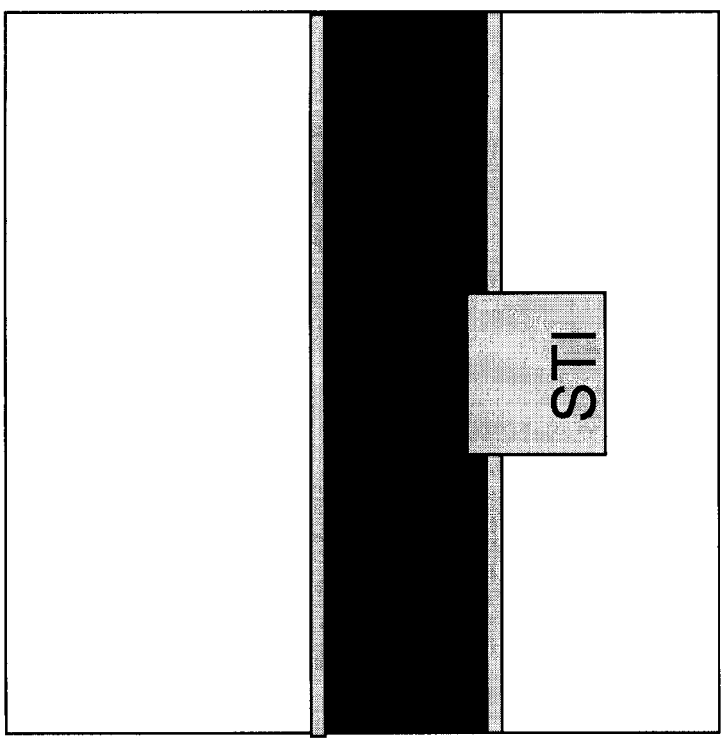
Figures 1, 4J:
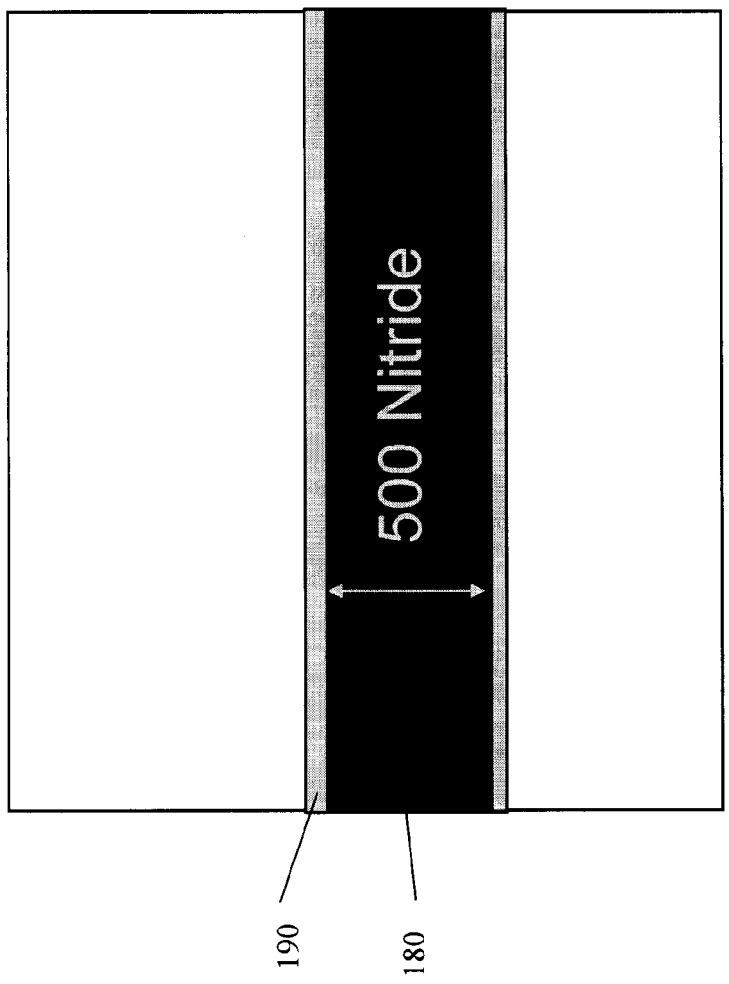
Figures 2, 4K:
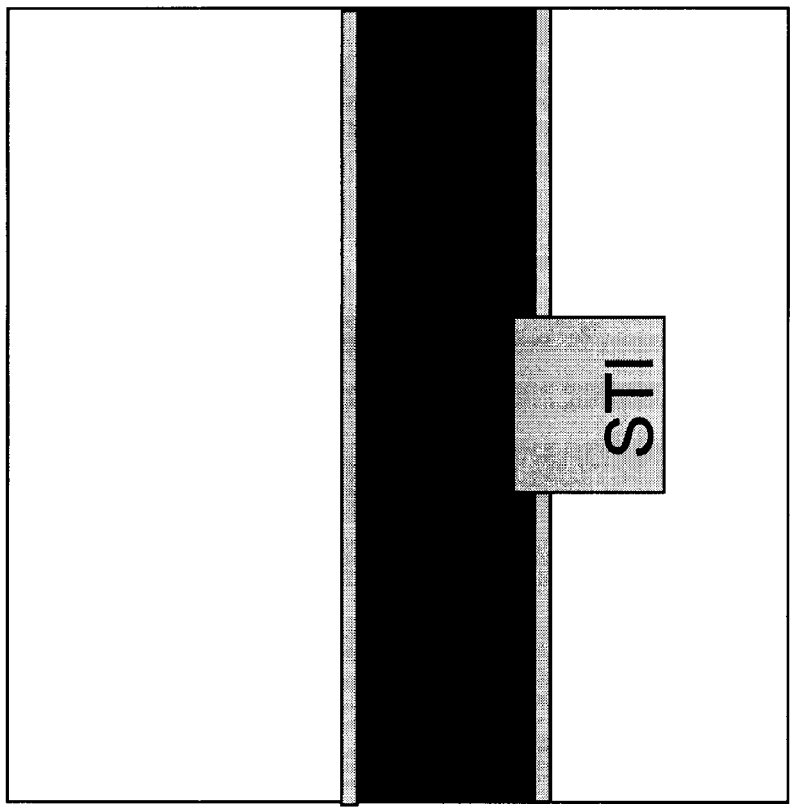
Figures 1, 4K:
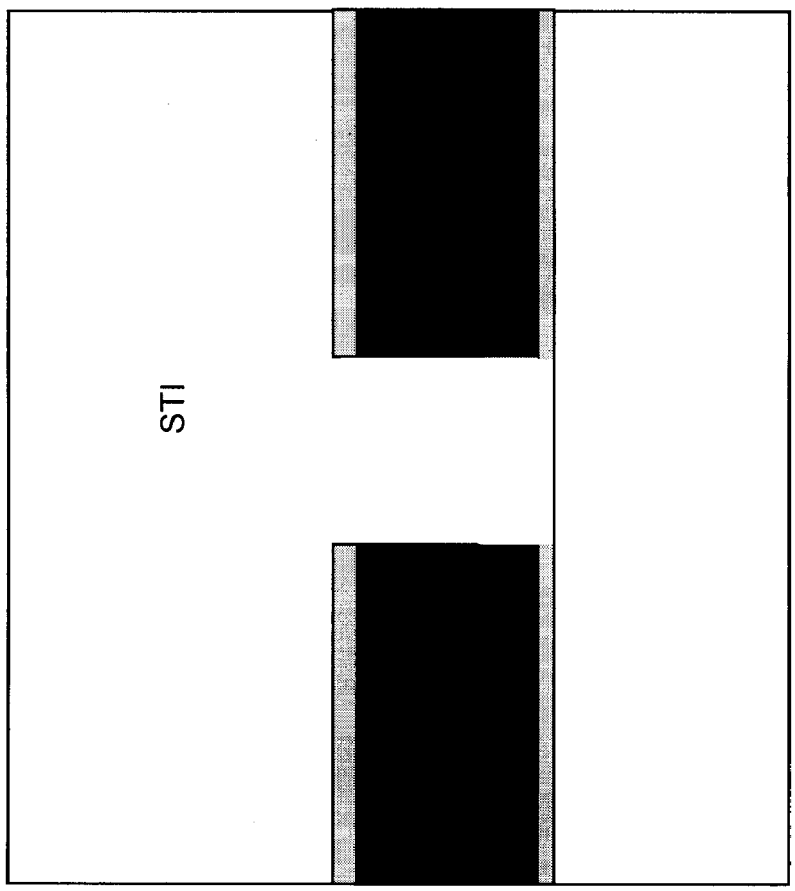
Figures 2, 4L:
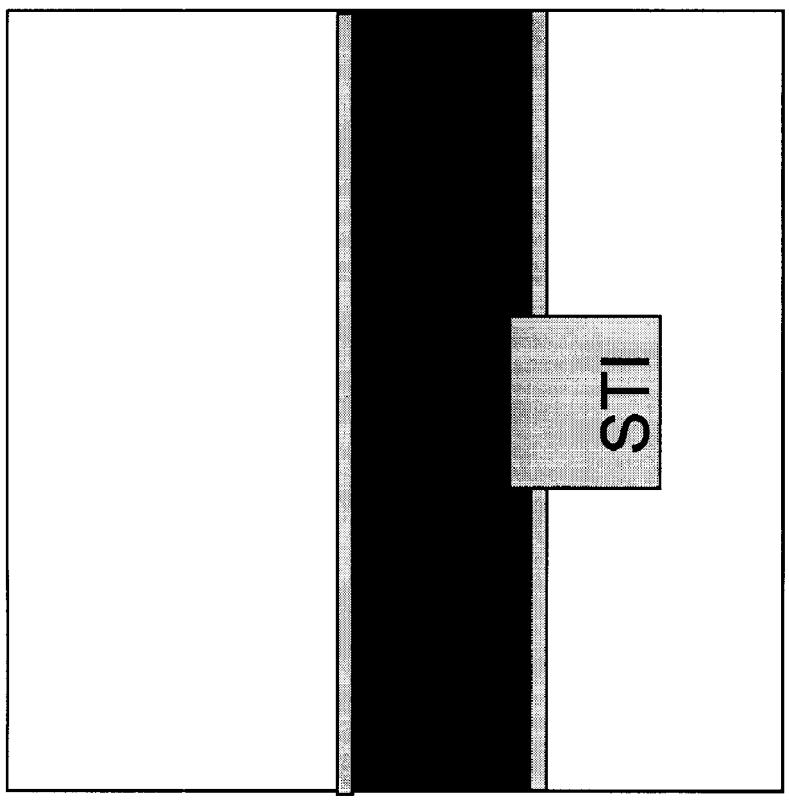
Figures 1, 4L:
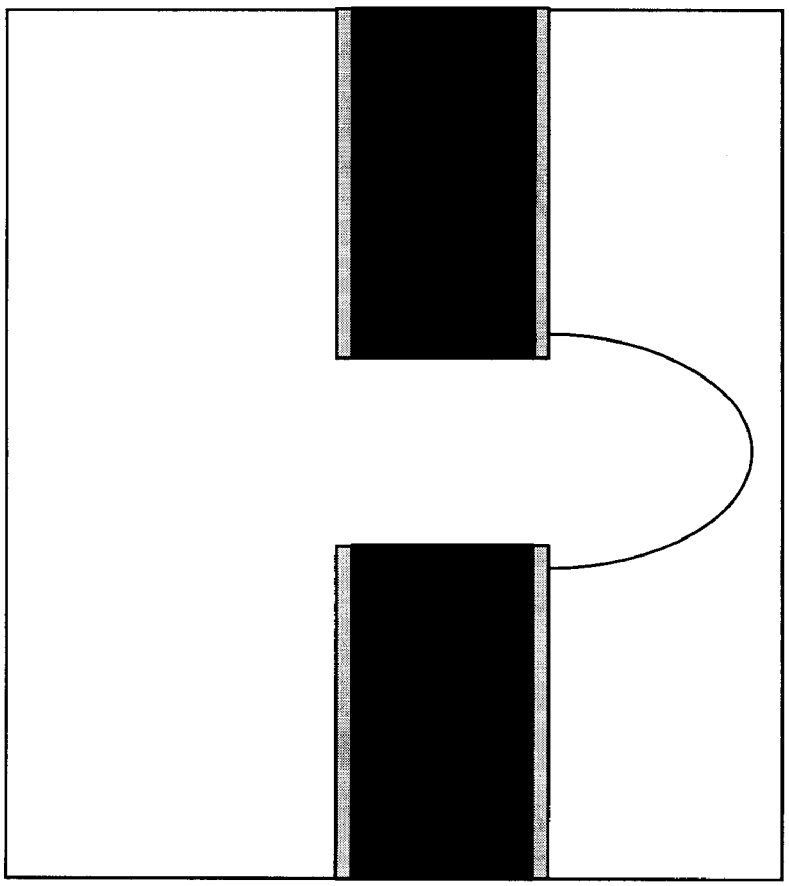
Figures 2, 4M:
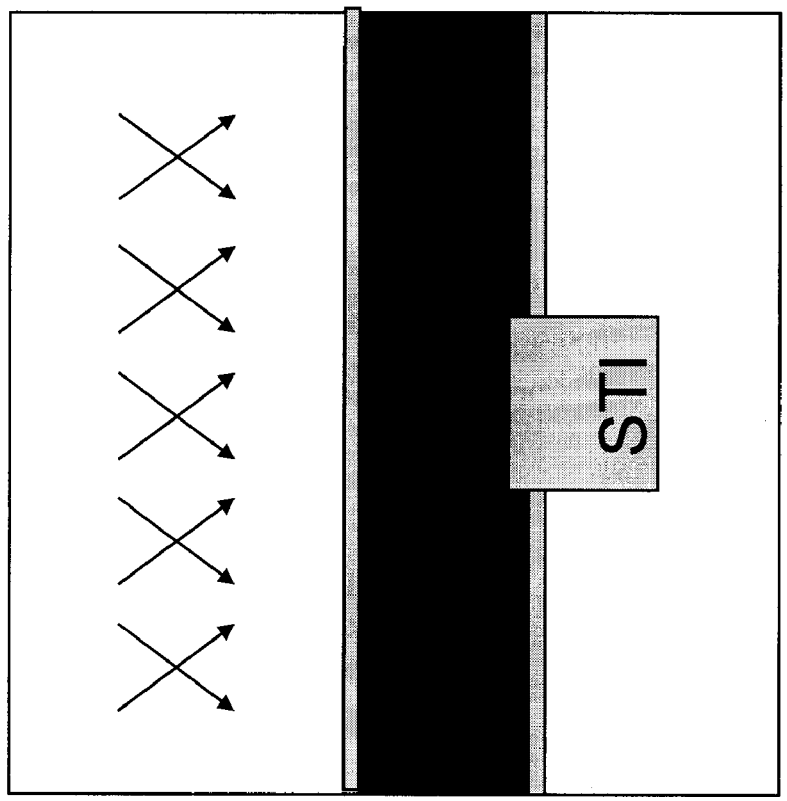
Figures 1, 4M:
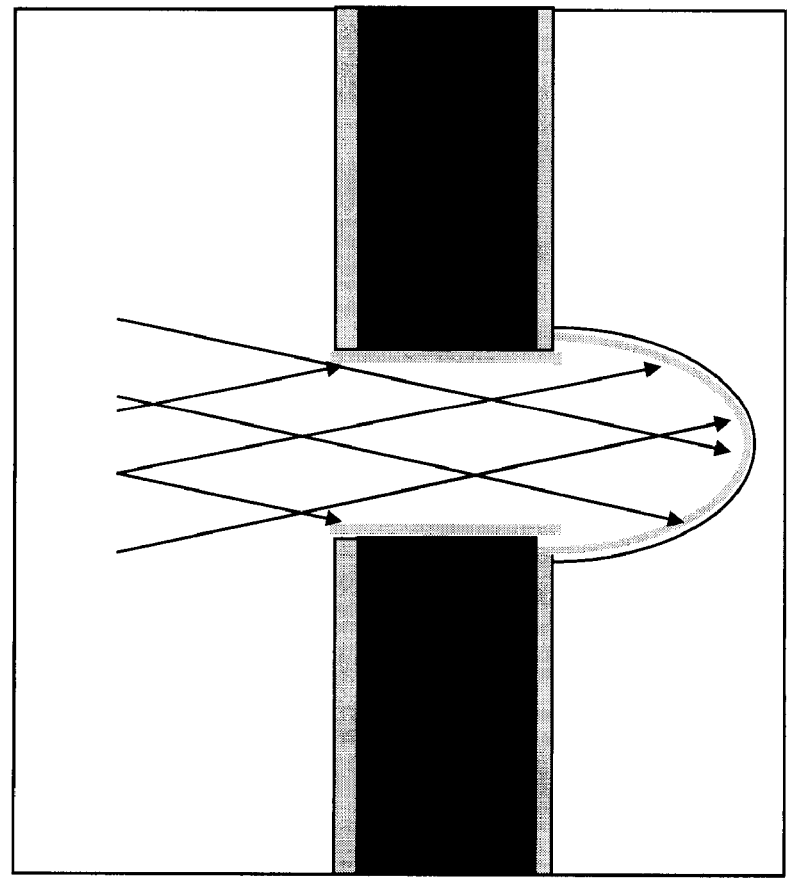
Figures 2, 4N:
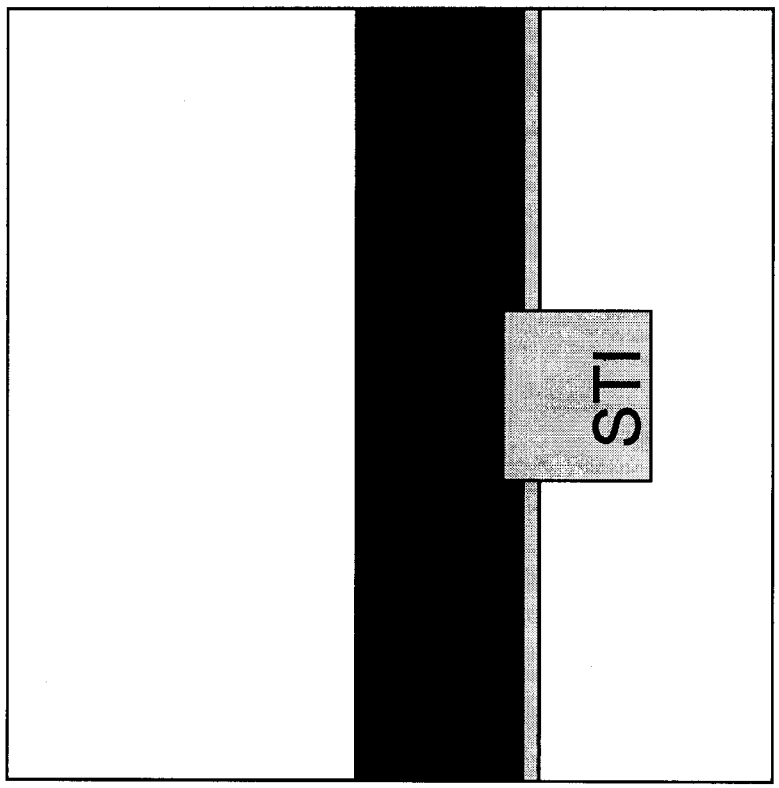
Figures 1, 4N:
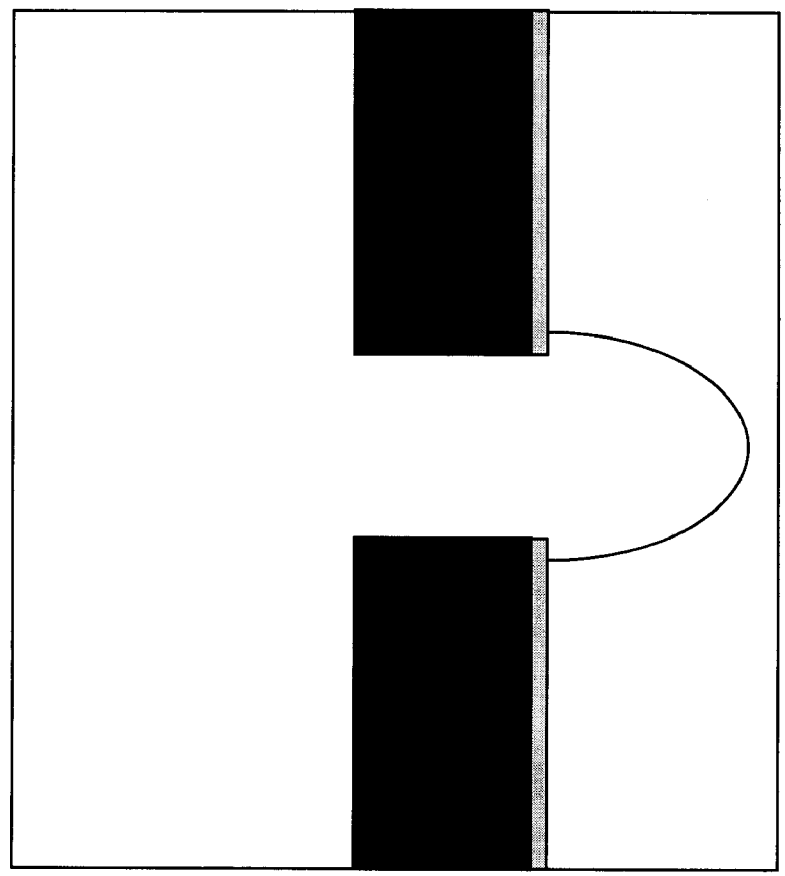
Figures 2, 4O:
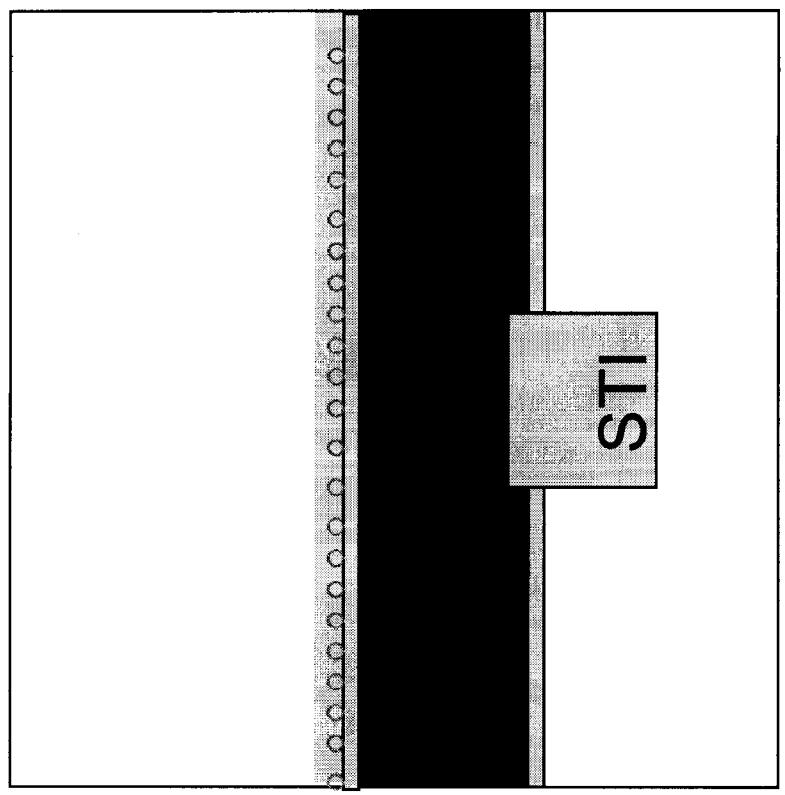
Figures 1, 4O:
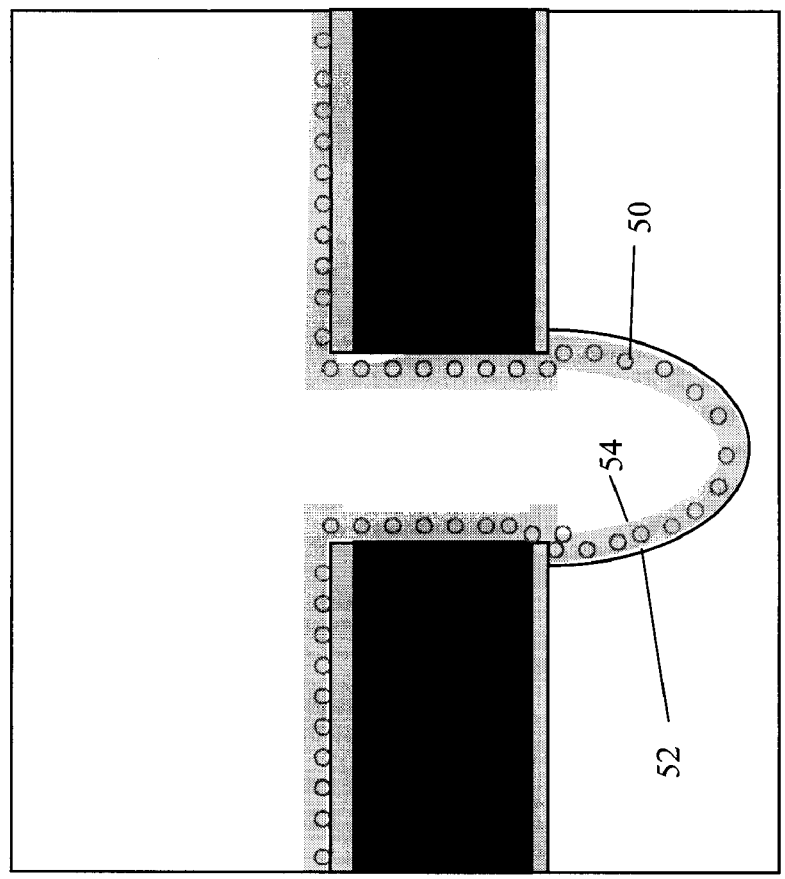

Along the first sidewall 20a, the second sidewall 20b of the first trench 16 and along the first sidewall 24a and the second sidewall 24b of the second trench 18 is a charge trapping layer 50 (shown in FIGS. 4O-1). As is well known, the charge trapping layer 50 can be made from Si-nc in SiN or silicon nitride (SiN) or nanocrystal. The charge trapping layer 50 is separated and insulated from the substrate 12 by a bottom insulator 52, such as silicon oxide (shown in FIGS. 4O-1). Within each of the first trench 16 and the second trench 18 is a control gate 40 and 42, respectively. The control gates 40 and 42 are insulated from the charge trapping layer 50 by a top insulator 54. In addition, the control gates 40 and 42 are insulated from the regions 30 and 32, along the bottom of each of the first and second trenches 16 and 18. The control gates 40 and 42 are formed such that the top portion thereof, exceeds the top of the planar surface 14 by an amount shown as 60. An insulating layer 70 is formed across the top surface 14 and the top level of the control gates 40 and 42. A top gate 80 is on the insulating layer 70.

In the operation of the cell 10, to erase the cell 10, there are two possible modes of operation. In a first mode of operation, charges trapped in the charge trapping layer 50 tunnel by the mechanism of Fowler-Nordheim tunneling through the top insulator 54 to the control gates 40 and 42 respectively. As an example, this can occur by applying the following voltages: 0 volts to the regions 30 and 32 and to the top gate 80. A high positive voltage on the order of +8 to +12 volts is applied to the control gates 40 and 42. Negative charges trapped in the charge trapping layer 50 are attracted by the positive voltages from the control gates 40 and 42 and tunnel through Fowler-Nordheim tunneling, through the top insulator 54 into the control gates 40 and 42. In a second mode of operation, charges trapped in the charge trapping layer 50 tunnel by the mechanism of Fowler-Nordheim tunneling through the lower insulator 52 to the substrate 12. As an example, this can occur by applying the following voltages: 0 volts to the regions 30 and 32 and to the top gate 80. A high negative voltage on the order of −8 to −12 volts is applied to the control gates 40 and 42. Negative charges trapped in the charge trapping layer 50 are repelled by the negative voltages from the control gates 40 and 42 and tunnel through Fowler-Nordheim tunneling, through the lower insulator 52 into the substrate 12.

To program the cell 10, there are a number possible modes of operation. In a first mode, which is by source side injection and is useful for high speed programming, the following voltages are applied. A positive voltage of +1.5 to 3.0 volts is applied to the top gate 80, sufficient to turn on the second channel region under the planar surface 14 between the trenches 16 and 18. The following voltages are applied to the second regions 30 and 32 respectively, 0 volts, and +5 volts, sufficient to turn on the channel region. A positive voltage of +2 volts is applied to the control gate 40, sufficient to turn on the channel region along the sidewall 20*b*, and +5 volts is applied to the control gate 42. As the channel region is turned on, electrons traverse the channel region from the second region 30 along the first sidewall 20*b* along the surface 14 between the trenches 16 and 18, and are then attracted by the positive voltage +5 from the control gate 42, and by the fact that they have high energy from the large positive voltage (+5v) applied to the second region 32. This causes the electrons in the channel near the top surface 14 to be injected onto the charge trapping layer 50. Thus, in this mode, the portion of the charge trapping layer 50 near the surface 14 is programmed.

In a second mode of programming, which is by channel hot electron injection, the same voltages as the first mode are applied except the voltage to the second region 32 is reduced to +2 volts. In this second mode, by the time the electrons reach the channel region, near the top surface 14, they do not have sufficient acceleration (caused by the lower attractive force of the voltage applied to the second region 32) to be injected onto the charge trapping layer 50. Instead, the electrons continue to traverse along the sidewall 24*a* and as they near the second region 32, they have sufficient acceleration to be injected onto the charge trapping layer 50, near the second region 32. Thus, in this mode, the portion of the charge trapping layer 50 near the bottom of the trench is programmed.

In yet another mode of programming, which is by channel hot electron injection near the top surface 14, the following voltages are applied: 0 volts is applied to the second region 32, +2 volts is applied to the second region 30, +3 volts is applied to the control gate 40, +6 volts is applied to the control gate 42, and +1.5 to 3.0 volts is applied to the top gate 80. Electrons traverse the channel region from the second region 32 to the second region 30, along the sidewall 24*a*. As the electrons near the top surface 14 of the substrate 12, the strong attractive force of the +6 volts on the control gate 42, as opposed to the weaker attractive force of +3 volts on the control gate 40 causes the electrons to be injected onto the charge trapping layer 50 along the sidewall 24*a* near the top planar surface 14.

In this manner, it is possible to program two bits for the charge trapping layer 50 along the sidewall of each trench, for a total of 4 bits per cell.

In yet another mode of programming, the following voltages can be applied. +4 volts to the second region 30 and +2 volts to the second region 32. +5 volts to the top gate 80. +5 volts to the control gate 40. −8 volts to the control gate 42. In this mode, which is a low power mode of operation, because a negative voltage is applied to the control gate 42, the channel would not turn on. However, if +5 volts is applied to the top gate 80, and +5 volts is applied to the control gate 40 approximately +4 volts would be transferred from the left portion of the trench 16 to the right corner of the top planar surface 14, near trench 18. Since control gate 42 is supplied with −8 volts, approximately +12 volts differential exists between the substrate 12 and the control gate 42 causing Fowler-Nordheim tunneling of electrons from the trapping layer 50 to the substrate 12.

To read, the cell 10, it depends on whether the cell 10 is programmed with one (1) bit in the charge trapping layer 50 along each of the sidewalls 20*b* and 24*a* or two (2) bits along each of the sidewalls 20*b* and 24*a*. Assume that the cell 10 is programmed with only 2 bits in total, i.e. one bit in the charge trapping layer along each of the sidewalls 20*b* and 24*a*. Then the following voltages are applied: +1.5-3.0 volts on the top gate 80, +2-3 volts on the control gate 40, 0 volts on the control gate 42, +2-3v. on the second region 30, and 0V on the second region 32. Because there is 0 volts applied to the control gate 42, whether the channel along that trench 18 is turned on or not is controlled by the trapping layer 50 along the sidewall 24*a*. The electron flow detected at the second region 32 is determinative of the charges trapped in the charge trapping layer 50 along the sidewall 24*a*. Another read method would be to force a read current, e.g. 100 nA at the second region 32 while a voltage, such as +2-3 volts is upplied at the first region, and then detect the read voltage Vr, at the second region 32. To read the charge trapping layer 50 along the sidewall 20*b* of the cell 10, the voltages are reversed.

In the event two bits are programmed in the charge trapping layer 50 along each of the sidewalls of the cell 10, then two read operations are necessary to detect the charges trapped near the top (near the planar surface 14) and the bottom (near the second region) of the charge trapping layer along each of the sidewalls. Thus, four read operations are necessary to read the cell 10 in total. In a first read operation, the following voltages are applied: +1.5-3.0 volts applied to the top gate 80, +2 volts applied to the second region 30, 0 volts applied to the second region 32, +2 volts applied to the control gate 40, and 0 volts applied to the control gate 42. The channel is turned on; the voltage on the control gate 40 is sufficient to turn on the channel region irrespective of the charges trapped in its associated charge trapping layer 50. Electrons traverse the channel from the second region 32 to the second region 30. The amount of electron flow detected at the second region 30 is determined primarily by the charges trapped in the trapping layer 50 along the sidewall 24*a*, near the bottom of the trench or near the second region 32. The charges trapped along the sidewall 24*a* in the trapping layer 50 near the top surface 14 in the trench 18 are shielded by the depletion region created by the +2 volts applied to the control gate 40 to the top right hand corner of the planar surface 14 and the trench 18.

A second read operation is then performed. The voltages applied in the second read operation is as follows: +1.5-3.0 volts applied to the top gate 80, +2 volts applied to the second region 32, 0 volts applied to the second region 30, +2 volts applied to the control gate 40, and 0 volts applied to the control gate 42. The channel is turned on; the voltage on the control gate 40 is sufficient to turn on the channel region irrespective of the charges trapped in its associated charge trapping layer 50. Electrons traverse the channel from the second region 30 to the second region 32. The amount of electron flow detected at the second region 32 is determined by the charges trapped in the trapping layer 50 along the sidewall 24a. However, because a positive voltage is applied to the second region 32, a depletion region is formed about the second region 32 which shields the threshold voltage caused by the electrons trapped in the charging layer 50 near the bottom of the trench 18 or near the second region 32. Thus, in this second read, the electron flow detected is primarily caused by the electrons trapped in the trapping layer 50 near the planar surface 14 along the sidewall 24a. For the third and fourth read operations, the voltages are the same as that for the first and second read operations, except the voltages applied to the control gates 40 and 42 and second regions 30 and 32 are reversed, thereby determining the state of charge trapping in the trapping layer 50 near the bottom for the trench 16 along the sidewall 20b, and near the top of the trench 16 near the planar surface 14.

Figure 2:
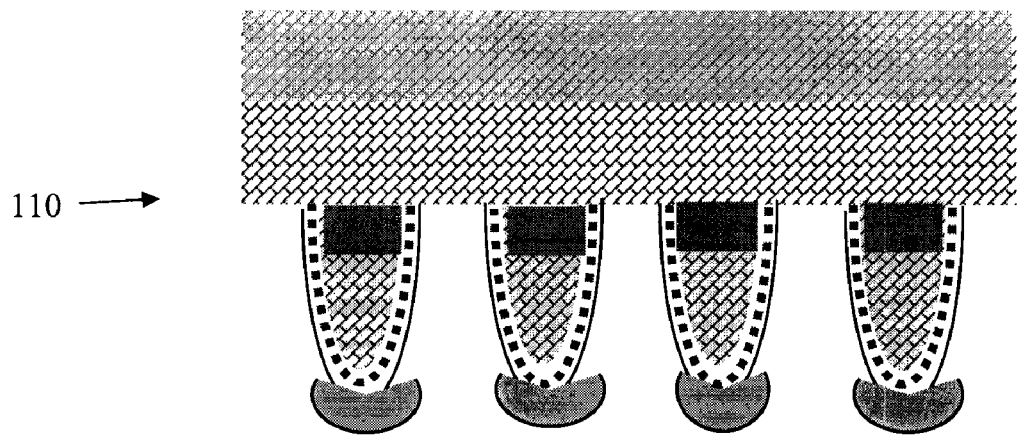
FIG. 2 is a second embodiment of a non-volatile memory cell of the present invention.

Referring to FIG. 2 there is shown a schematic cross sectional view of another memory cell 110 of the present invention. The memory cell 110 is similar to the memory cell 10, except the height of the control gate 40/42 in each of the trenches 16/18 is such that the top of the control gate 40/42 does not protrude above the planar surface 14. As a result, the insulating layer 70 on the trenches 16/18 may be "flat". Because of this flat topology, a simpler process may be used to manufacture the cell 110 or an array of such cells 110. However, because the trenches 16/18 do not "protrude" above the planar surface 14, the height of the control gates 40/42 of the memory cell 110 is less than the height of the control gates 40/42 of the memory cell 10. As a result, the cell cannot store a bit in the trapping layer 50 near the top planar surface 14; thereby providing for only the storage of two bits per cell 110. In addition, programming of the cell 110 can occur only through the mechanism of source side injection or channel hot electron injection.

Figure 3:
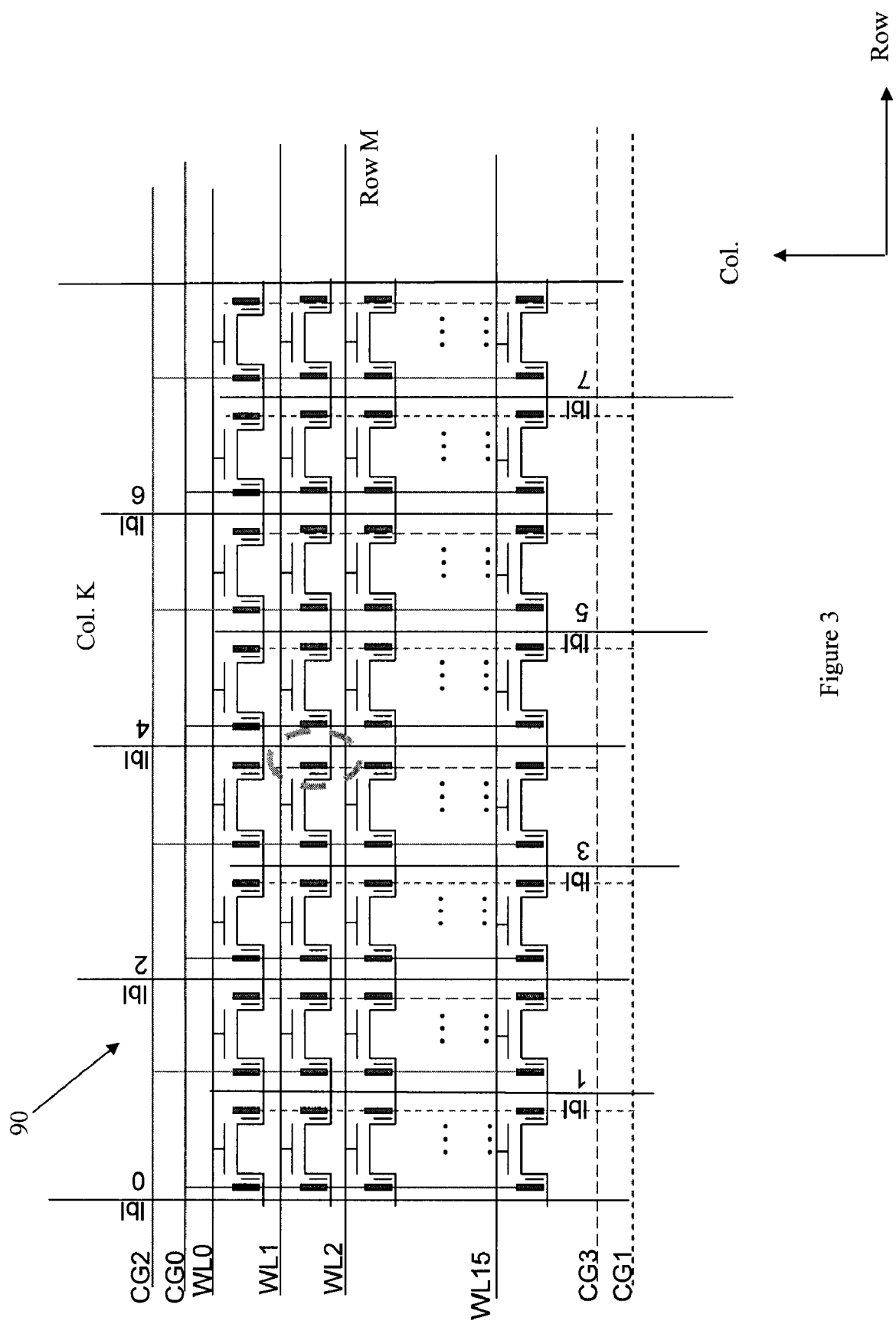
FIG. 3 is a schematic diagram of an array of memory cells of the present invention, wherein the memory cells can be either the first embodiment shown in FIG. 1 or the second embodiment shown in FIG. 2, of the present invention.

Referring to FIG. 3 there is shown a schematic diagram of a memory array 90 comprising of an array of either memory cells 10 or 110 of the present invention. The plurality of memory cells 10 or 110 are laid out in a plurality of rows and columns, as indicated. It should be noted that the term "row" and "column" are just for reference, and may be interchangeably used. For cells 10 or 110 that are arranged in the same row, e.g. row M, cells to one side share a common second region 32, a common control gate 42 (in a common trench 18), and cells to another side share a common second region 30, and a common control gate 30 (in a common trench 16). In addition, the top gate 80 (shown as WLn) extends and connects to each of the cells in the same row. For cells that are arranged in the same column, e.g. column K, the cells share a common control gate 30/32 and a common trench 16/18, and a common second region 30/32. The second regions are shown as "lbln". As will be shown, the array 90 is made such that there is no isolation, such as STI, between adjacent rows of memory cells 10 or 110. Thus, the array 90 is an STI free memory array which reduces defect density.

Referring to FIGS. 4A-1 and 4A-2 there is shown a sequence of steps to make the array 90 of memory cells 10 or 110 of the present invention. FIGS. 4A-1 through 4AH-1 show the sequence of steps to make the memory array portion of the present invention, whereas FIGS. 4A-2 through 4AH-2 show the sequence of steps to make the peripheral circuits for the memory array portion of the present invention.

An exemplary mask sequence for the manufacturing of the array 90 is as follows:
  DIFF
  BLLI (FLGT mask)
  TROX
  GSTI (Option)
  MWEL
  FLGT
  BBLC
  CCGO
  CCGP (Option)
  WL_APT (Option)
  CCGC
  MPOL
  HNWL
  HPWL
  LNWL
  LPWL
  LVOX
  Poly (Peri gate)
  WLCG
  NLDD
  PLDD
  NHDD
  PHDD
  NNII
  PPII
  PROT
  CONT
  MTL1
  VIA1
  MTL2
  VIA2
  MTL3
  BPAD
  WL_Iso (Option)

In the first step of the method of the present invention, a layer of pad oxide 120 of approximately 110 angstroms, is grown in the substrate 12. It should be noted that the dimensions disclosed herein are examples only and that other dimensions can be used depending on the lithographic node used. A layer of polysilicon 120 of approximately 200 angstroms is then formed on the layer 110. A layer of Silicon nitride 140 of approximately 1400 angstroms is then formed on the layer of polysilicon 130. A layer of TEOS deposited silicon dioxide 150 of approximately 300 angstroms is then formed on the layer 140. Finally, a layer of SiON 160 of approximately 480 angstroms is then formed on the layer 150. The layers 120, 130, 140, 150 and 160 can be formed by conventional means.

In the next step, shown in FIG. 4B, a photoresist layer 170 is then applied on the SiON 160. A masking step is performed in the peripheral portion of the array 90, as shown in FIGS. 4B-2, creating an opening in the peripheral portion.

In the next step, the opening in the peripheral portion of the array 90 is used to etch through the layers: 160, 150, 140, 130 and 120 and into the substrate 12, as shown in FIG. 4C-2. The photoresist 170 is then removed.

The opening in the periphery is then extended into the substrate 12 forming a trench of approximately 2000-3000 angstroms deep. The layer 160 of SiON is removed. The resultant structure is shown in FIG. 4D.

An oxide dip (DHF dip) is performed on the structure The resultant structure is shown in FIG. 4E.

A layer of sacrificial oxide is deposited on the structure shown in FIG. 4E, followed by an oxide dip (DHF dip) step. This is followed by a HDP (High Density Plasma) deposition of silicon nitride layer. The resultant structure is then subject to a CMP etch with a selectivity of SiN to silicon oxide. Thus, when the silicon oxide in the trench in the periphery is detected, the CMP stops. The resultant structure is shown in FIG. 4F.

A partial oxide etch is performed on the structure shown in FIG. 4F to reduce the height of the oxide in the trench (which forms the STI) in the periphery of the array 90. The resultant structure is shown in FIG. 4G.

The layer of silicon nitride 140 is then removed by H3PO4. The layer of polysilicon 130 is removed by APM (Ammonium Peroxide Mixture) or dilute HF. The resultant structure is shown in FIG. 4H.

An ion implant process is then performed in the array portion of the memory device 10. This implant is on the order of 1E11 to 1E14 $cm^{-2}$ and is for the purpose of preventing punch through. The resultant structure is shown in FIG. 4I.

Silicon nitride 180 is then deposited on the structure shown in FIG. 4I, after the photoresist is removed. The silicon nitride 180 deposited is on the order of 500 angstroms. A layer of TEOS oxide 190 of approximately 800 angstroms is then deposited on the layer 180 of silicon nitride 180. The resultant structure is shown in FIG. 4J.

Photoresist is then applied on the structure shown in FIG. 4J. A masking operation is performed, and portions of the photoresist are exposed and opened, forming a plurality of spaced apart substantially parallel openings that would form trenches in the column direction. Through these openings, the layer of TEOS oxide 190, the silicon nitride 180 and the pad oxide are removed. The photoresist is then removed. The resultant structure is shown in FIG. 4K.

Through the opening, the substrate 12 is etched to a depth of approximately 500 angstroms, with undercut. As a result of the undercut, the "trench" formed is curvilinearly shaped. The resultant structure is shown in FIG. 4L.

Implant of Boron 11 with a large angle is then performed on the structure shown in FIG. 4L. The resultant structure is shown in FIG. 4M.

The structure shown in FIG. 4M is subject to a HF dip process to remove the TEOS oxide 180. The resultant structure is shown in FIG. 4N.

A layer of oxide 52 of approximately 30 angstroms is then deposited on the structure shown in FIG. 4N. The charge trapping layer 50 is then formed on the oxide layer 52. This can be done by deposition of nanocrystals through CVD. Alternatively, the charge trapping layer 50 can be a silicon rich nitride (SRN) layer, formed by the deposition of SiH4/NH3. A Silicon rich nitride charge trapping layer 50 is preferable because the control gate 40/42 can then be made out of polysilicon or metal. Finally, the charge trapping layer 50 can also be made from silicon nitride. Thereafter another insulating layer 54 can be formed on the charge trapping layer 50. The layer 54 can be silicon oxide or it can be a composite layer of ONO (silicon oxide/silicon nitride/silicon oxide), of approximately 60 angstroms. The resultant structure is shown in FIG. 4O.

Figures 2, 4P:
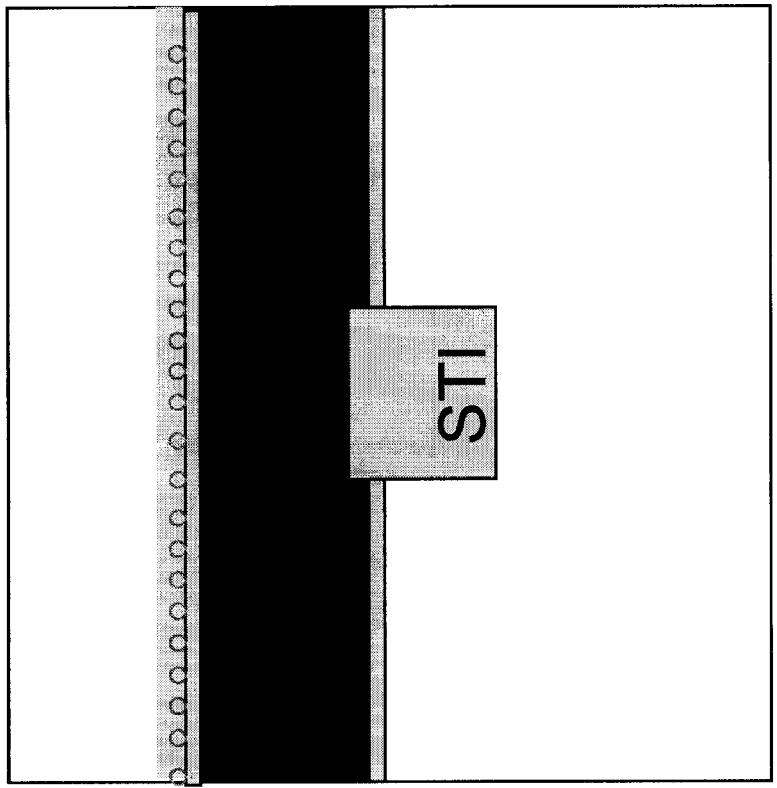
Figures 1, 4P:
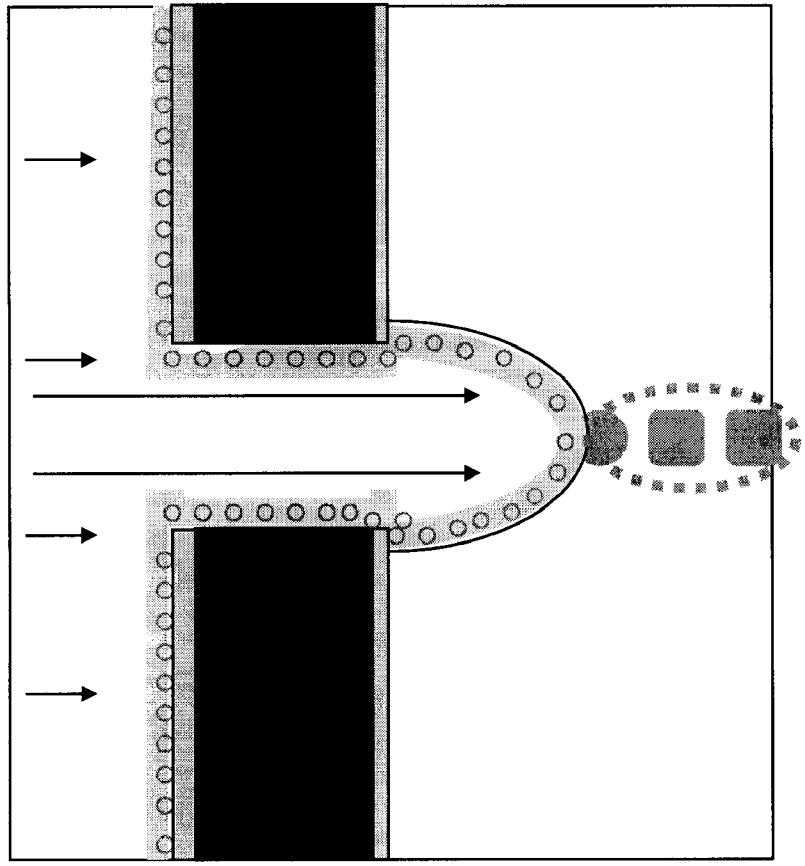

The structure shown in FIG. 4O is then subject to an implant step of Arsenic or phosphorus on the order of 1E12 to 1E14 $cm^{-2}$ to form the second regions 30/32 at the bottom of the trenches 16/18. Of course the implant dose and species would depend on the process node. The resultant structure is shown in FIG. 4P.

Polysilicon is then deposited everywhere filling the trenches 16/18 to form the control gates 40/42. The polysilicon 40/42 is subject to in-situ doping to render it conductive. The doping is at 1.5E20, 600 angstroms. The resultant structure is shown in FIG. 4Q.

Figures 2, 4Q:
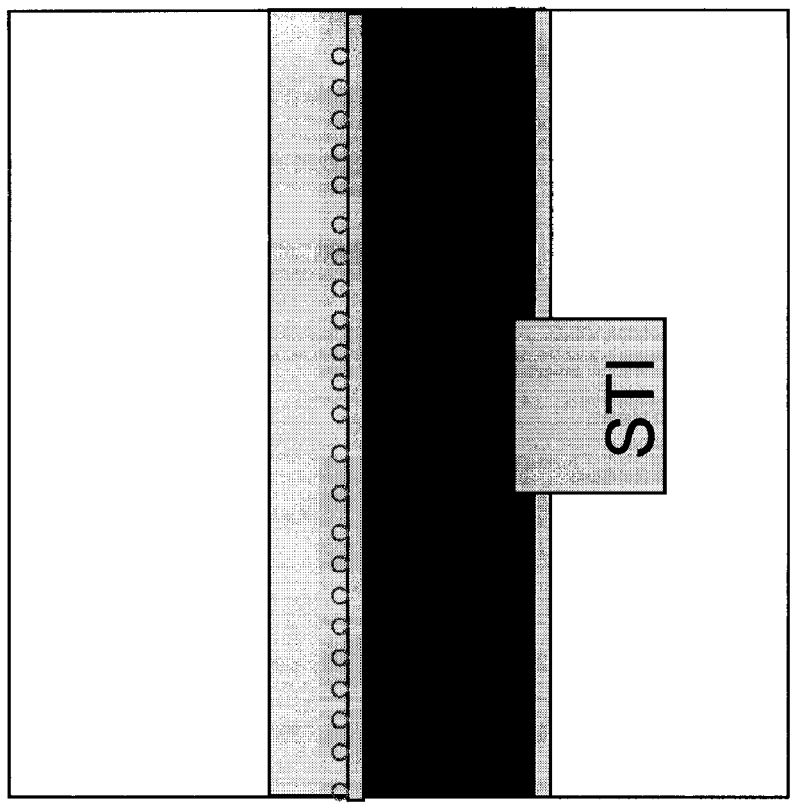
Figures 1, 4Q:
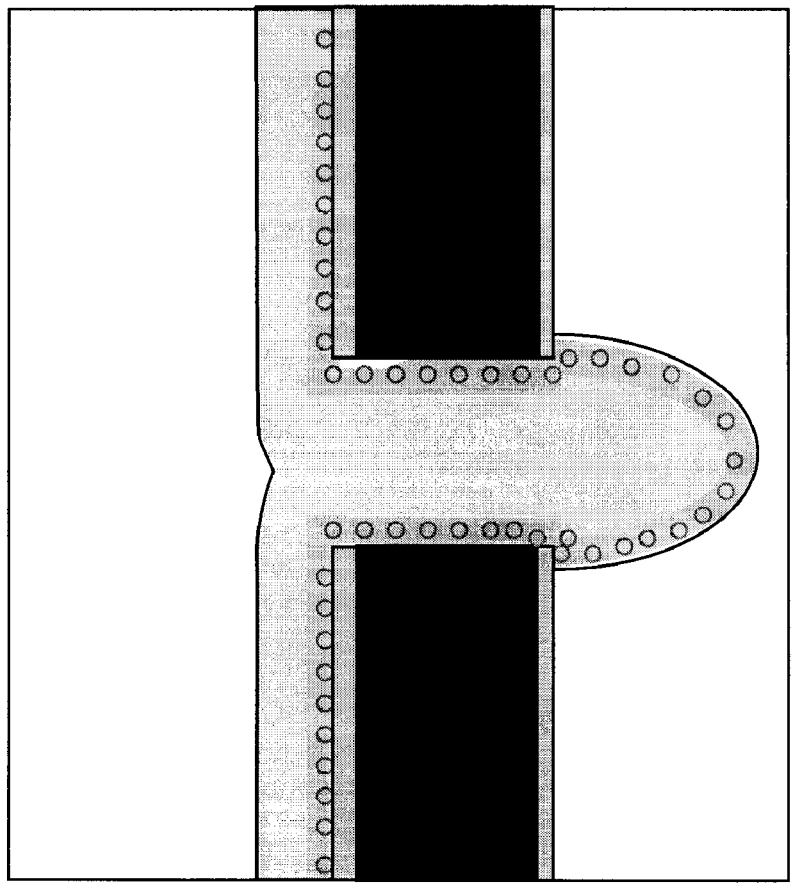

The structure shown in FIG. 4Q is then subject to a poly etch step. The top of the control gate 40/42 can be etched such that it is above the planar surface 14 of the substrate 12 by the amount 60 as shown in the first embodiment as shown in FIG. 1, or the etch can proceed such that the top of the control gate 40/42 is beneath the top planar surface 14 of the control gate 40/42, as in the second embodiment shown in FIG. 2. The resultant structure is shown in FIG. 4R.

Figures 2, 4R:
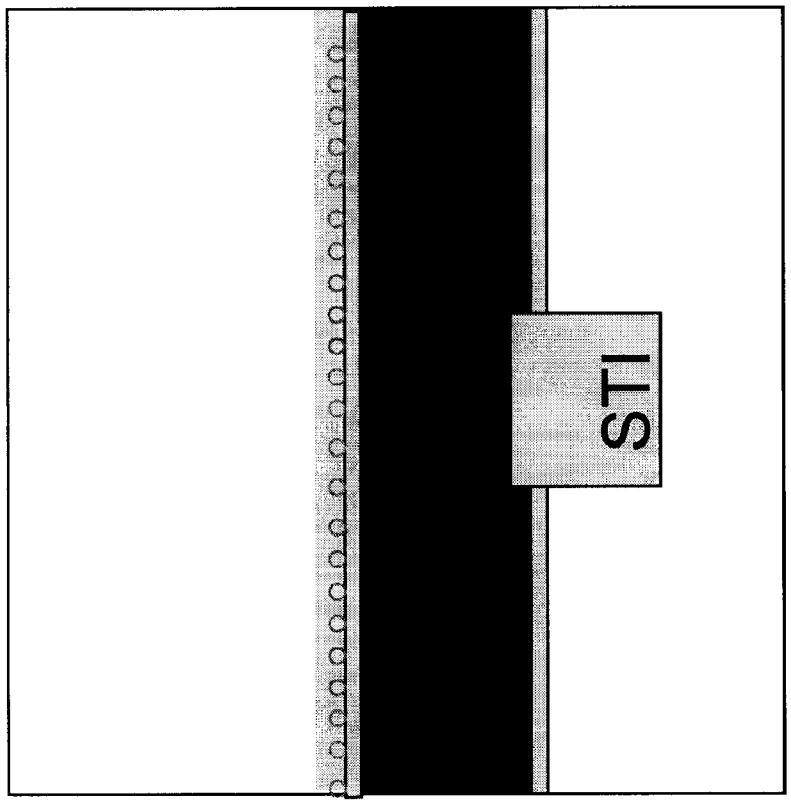
Figures 1, 4R:
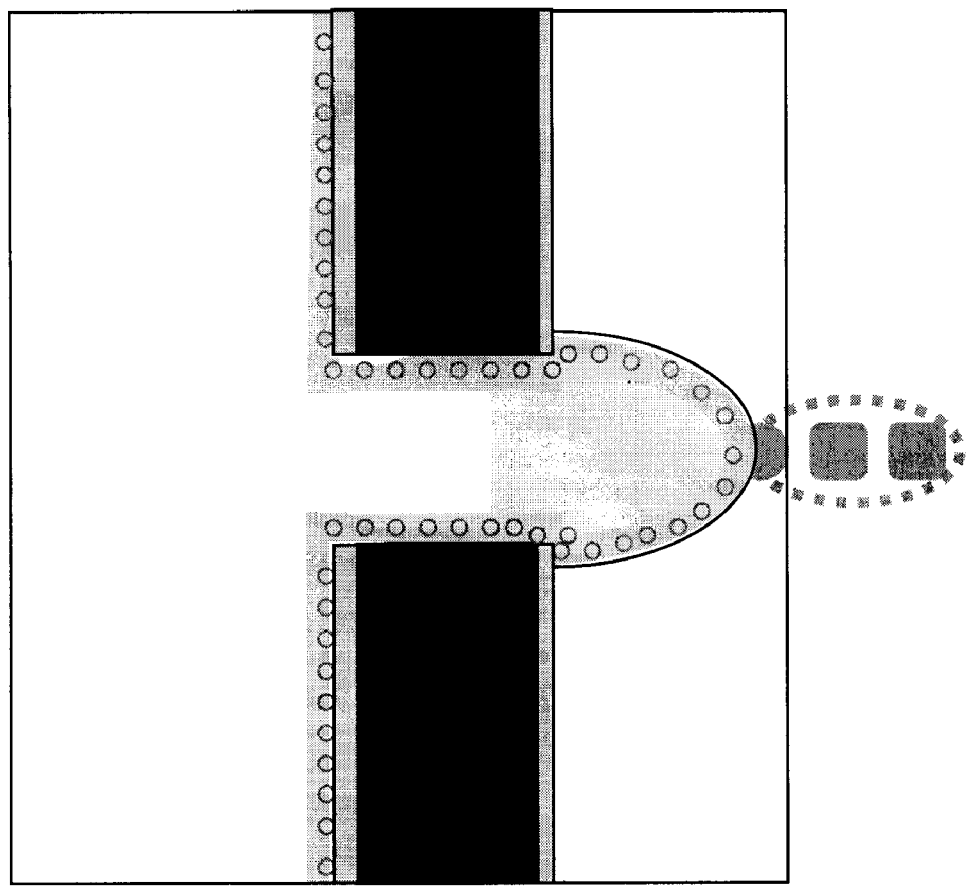

The structure shown in FIG. 4R is then subject to a HDP oxide deposition, whereby silicon dioxide is deposited everywhere. Within each trench, the silicon dioxide is deposited on top of the polysilicon, which forms the control gates 40/42. The resultant structure is shown in FIG. 4S.

Figures 2, 4S:
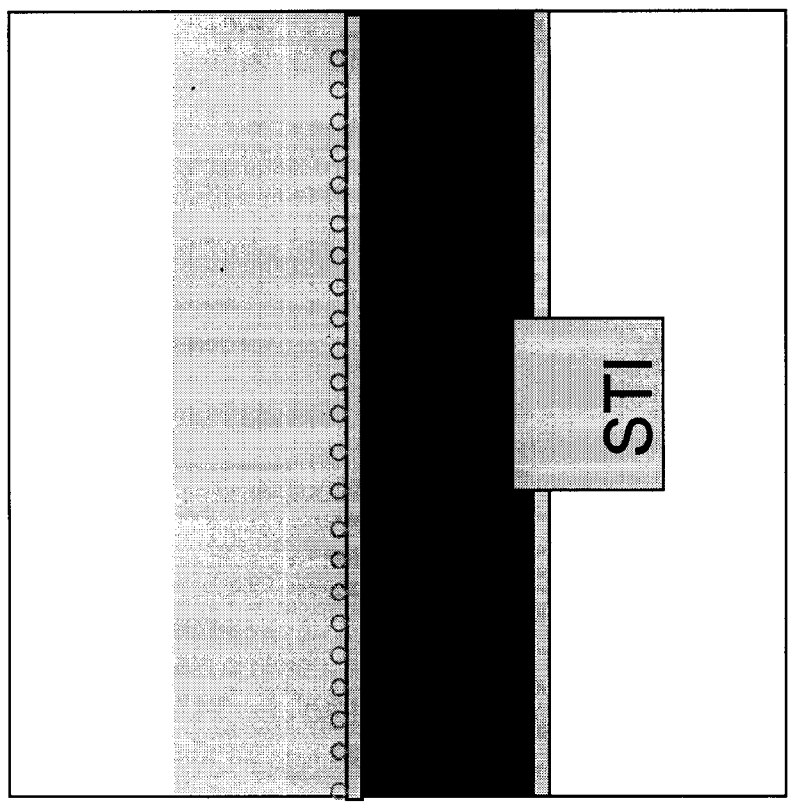
Figures 1, 4S:
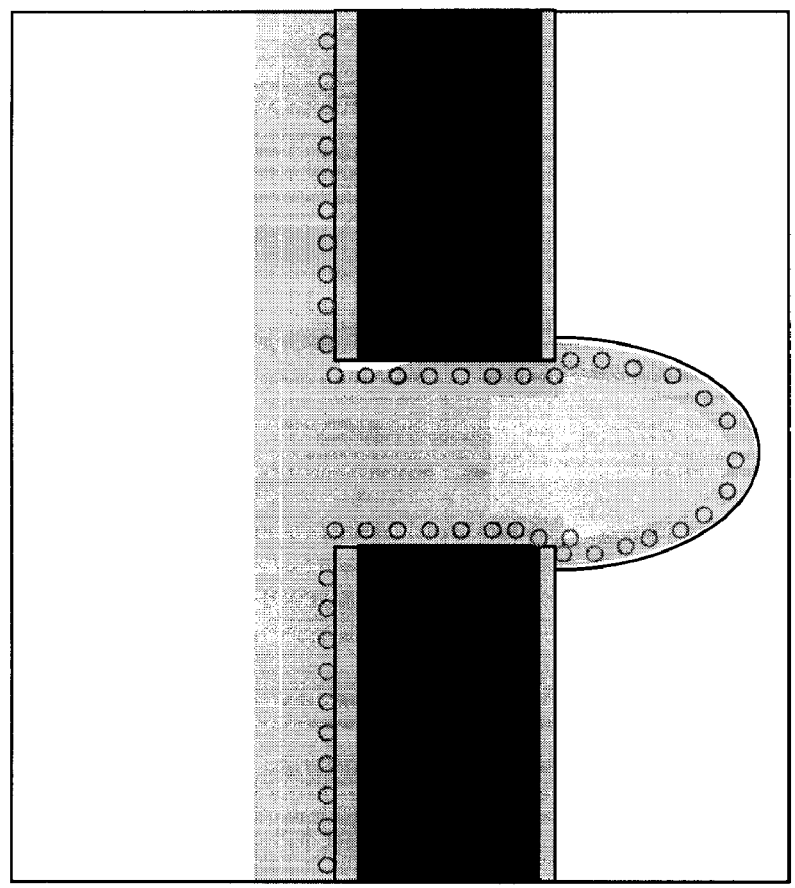
Figures 2, 4T:
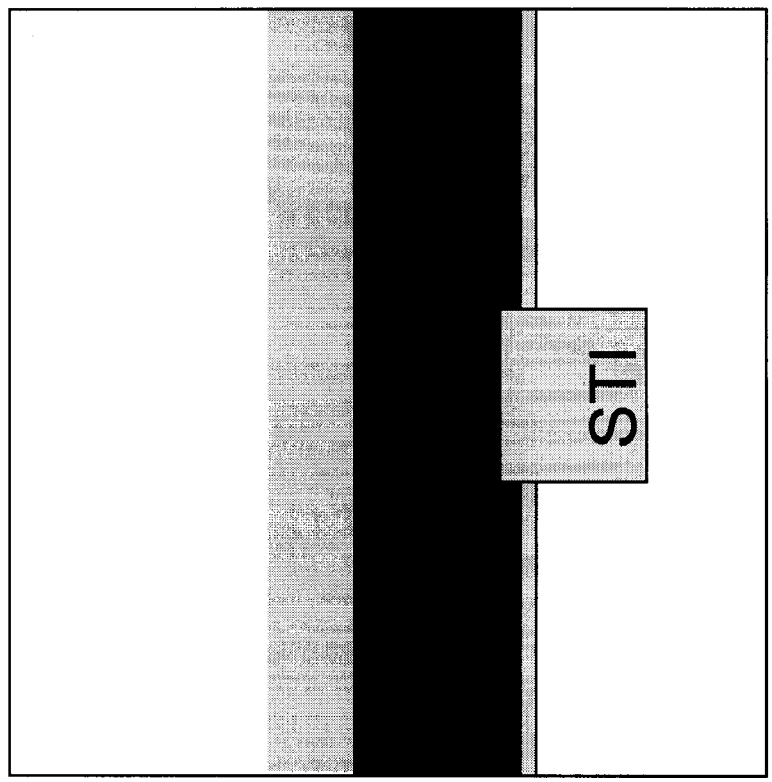
Figures 1, 4T:
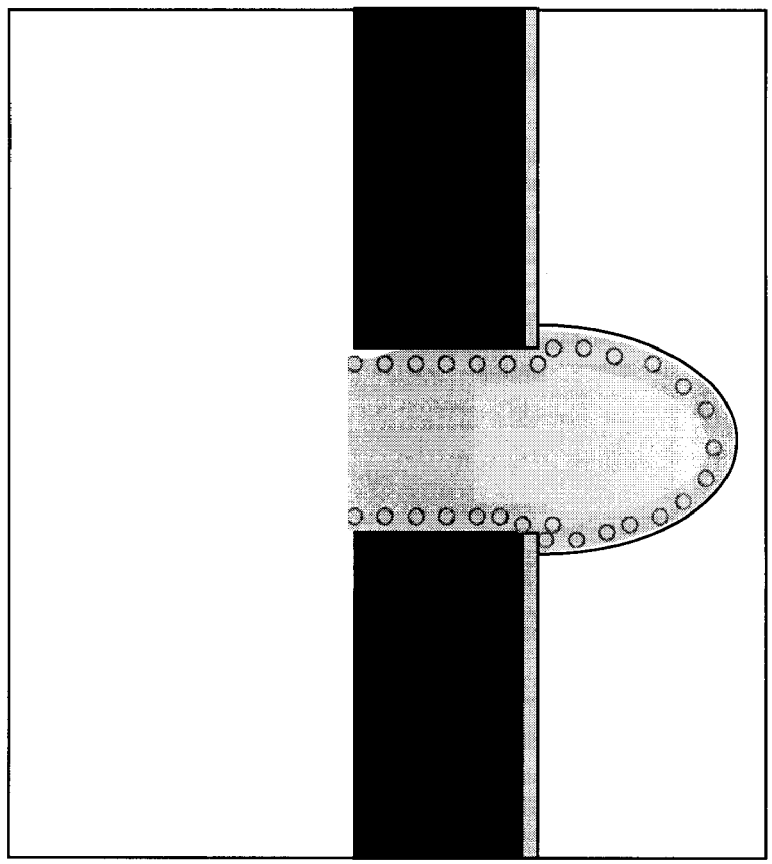

The structure shown in FIG. 4S is then subjected to a blanket oxide etch, whereby the silicon dioxide is etched back until the silicon nitride layer 180 is reached. The resultant structure is shown in FIG. 4T.

Figures 2, 4U:
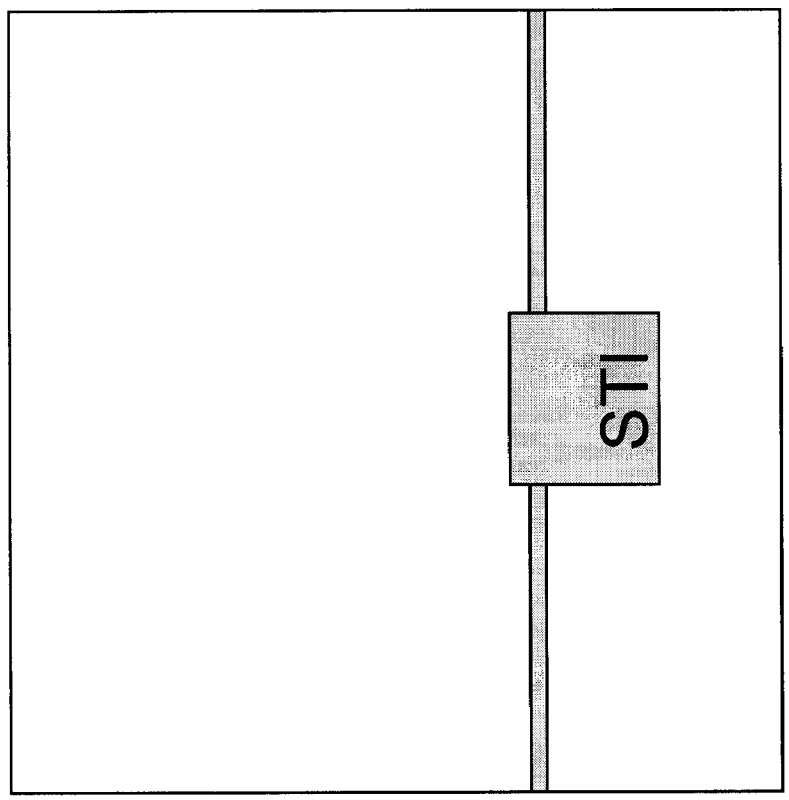
Figures 1, 4U:
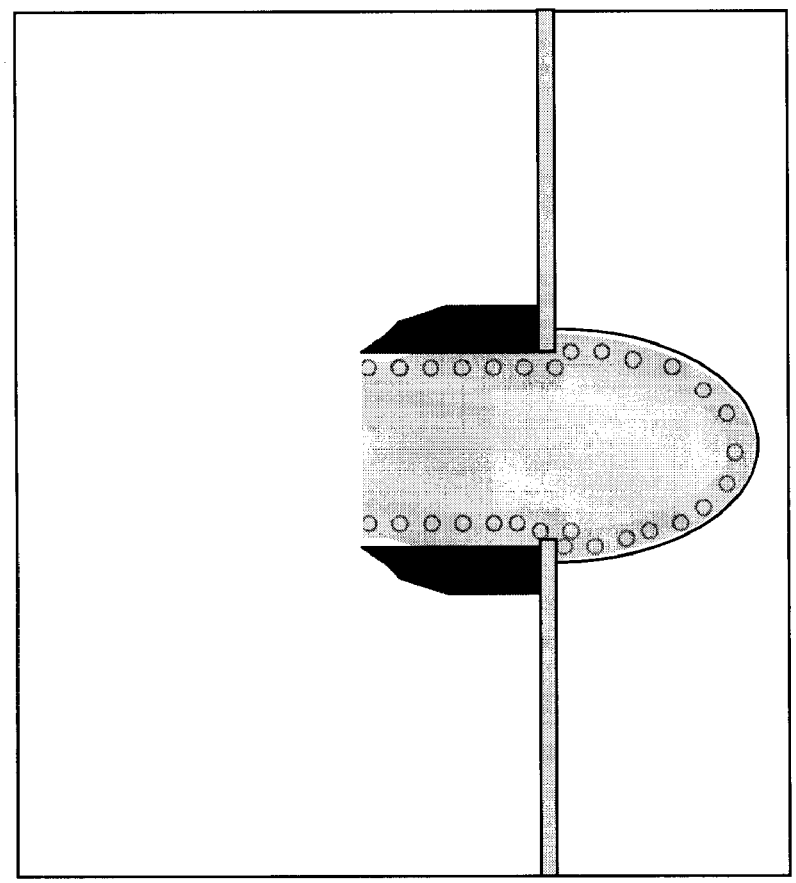

The layer of silicon nitride 180 is then subject to an anisotropic etch until nitride spacers are formed adjacent to each "stack" consisting of silicon dioxide on polysilicon which is in the trench. The resultant structure is shown in FIG. 4U.

Figures 2, 4V:
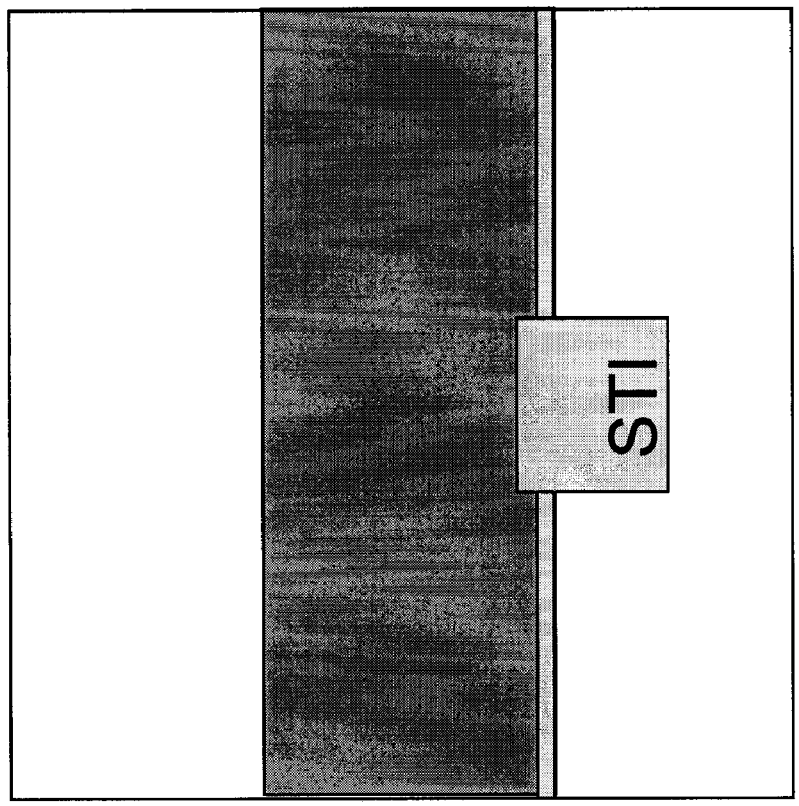
Figures 1, 4V:
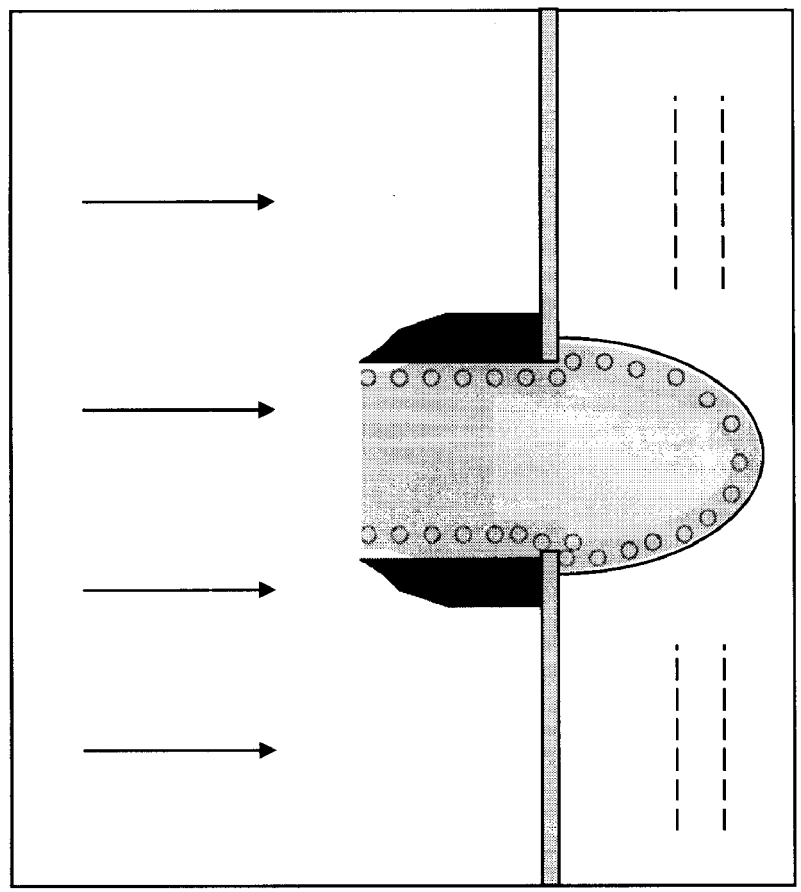

Implant to prevent punch through is then made. This can be Boron species at an implant dose of 1E10 to 1E12 $cm^2$. Of course such species and dosage depend on the process node. This is done by applying a photoresist to the peripheral region, while implant is done in the memory region. After the implant step, the photoresist is removed. The resultant structure is shown in FIG. 4V.

The nitride spacers are then removed by either a wet or dry etch so long as it is selective with respect to silicon dioxide. A sacrificial layer of silicon dioxide is deposited. The layer of sacrificial silicon dioxide is etched. The deposition and removal of the sacrificial silicon dioxide causes some silicon dioxide to remain along the sidewall. As a result, the deposition of silicon dioxide by HTO in the step that results in the structure shown in FIG. 4W results in additional silicon dioxide being formed in the circled corner area 200. The resultant structure is shown in FIG. 4W.

Figures 2, 4W:
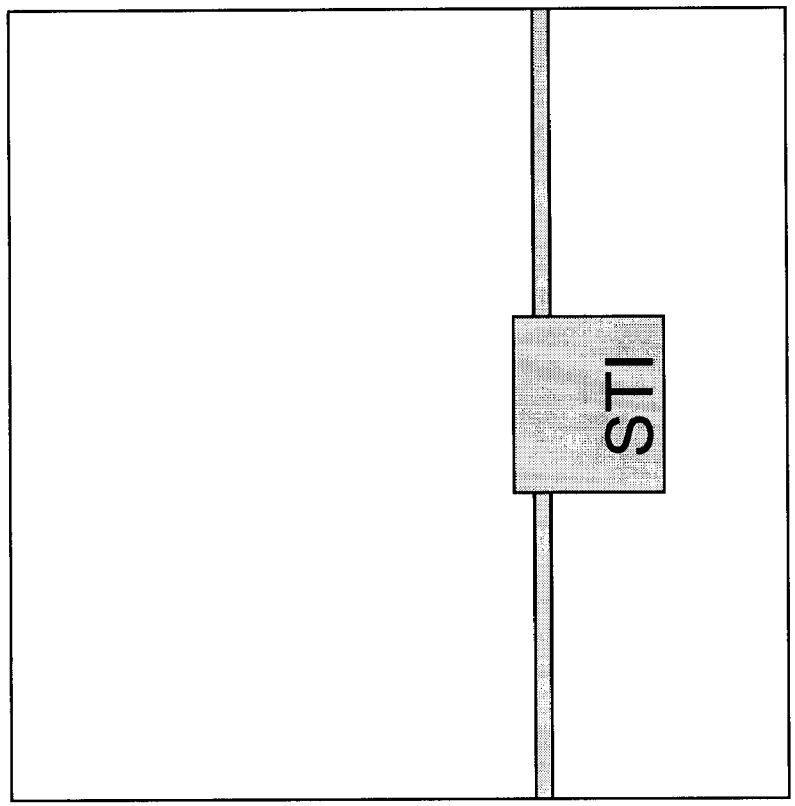
Figures 1, 4W:
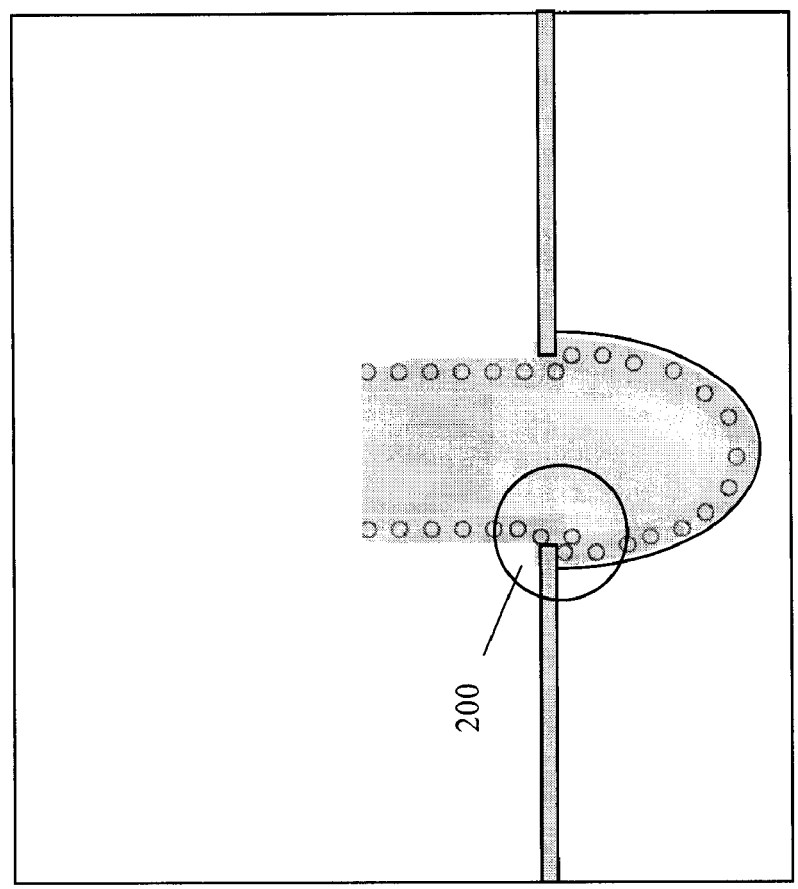

A layer of approximately 150 angstroms of silicon dioxide is then deposited by HTO on the structure shown in FIG. 4W. This forms the gate oxide layer for the top gate 80. The resultant structure is shown in FIG. 4X.

Figures 2, 4X:
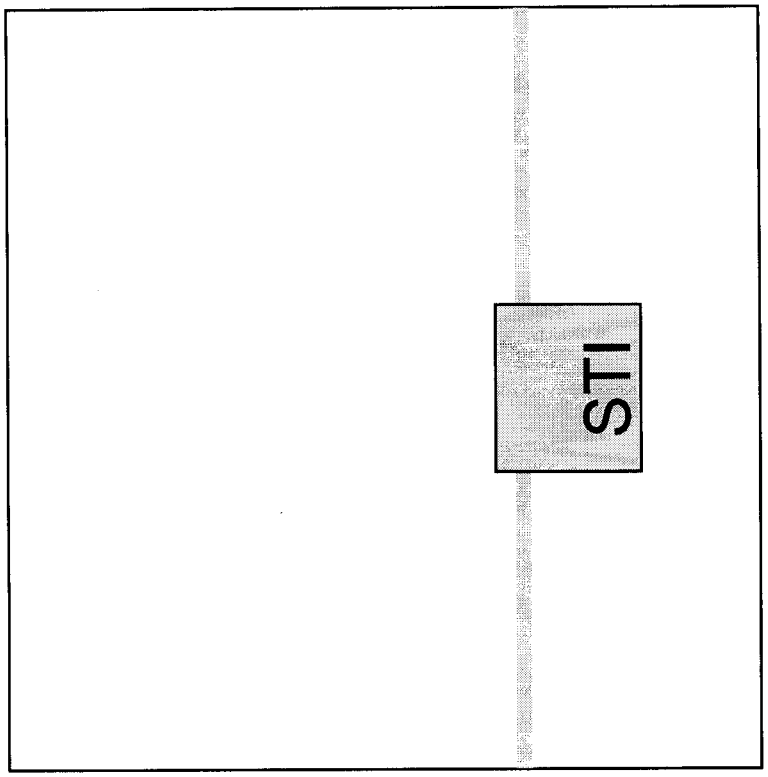
Figures 1, 4X:
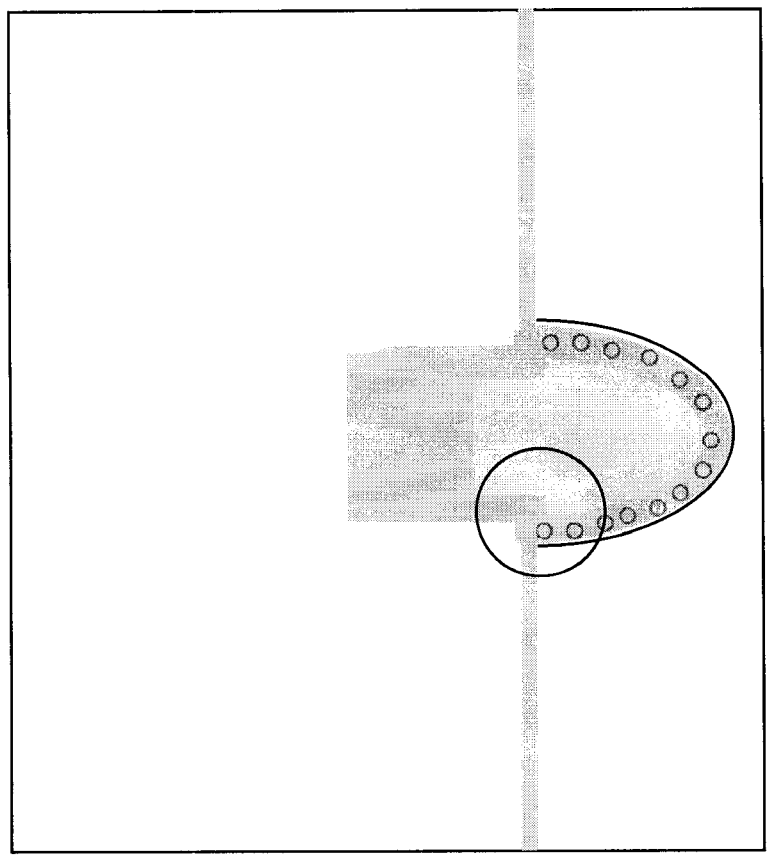
Figures 2, 4Y:
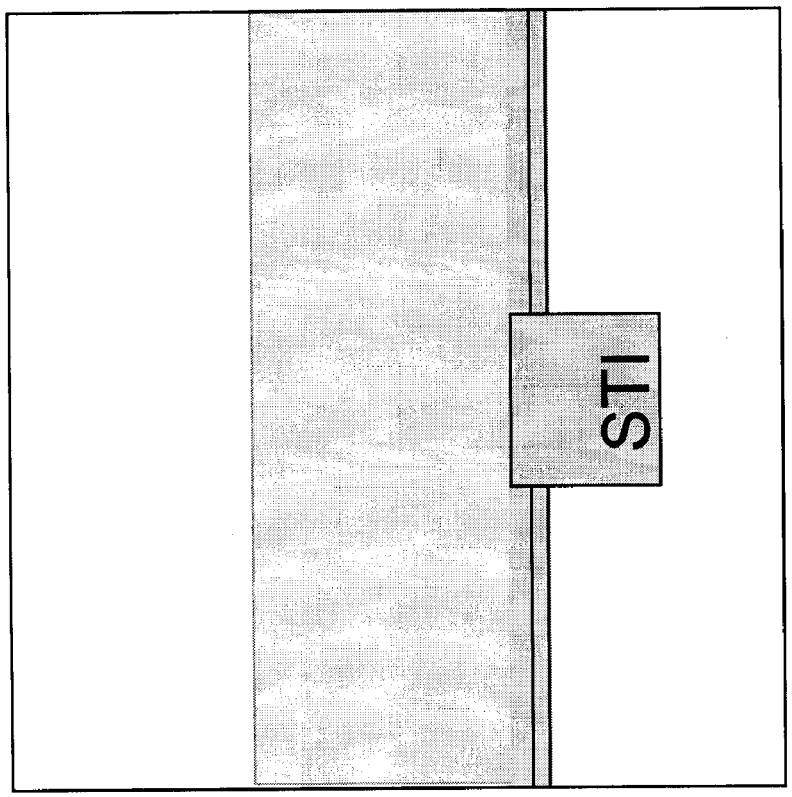
Figures 1, 4Y:
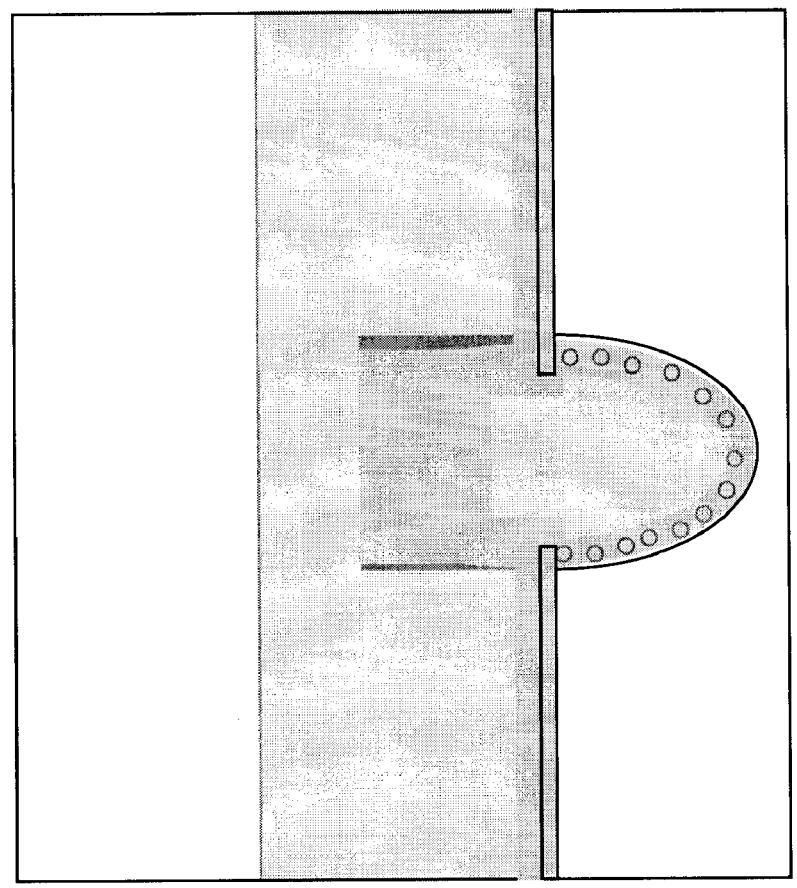

Polysilicon is then deposited on the structure shown in FIG. 4X forming the top gate 80. The resultant structure is shown in FIG. 4Y.

Figures 2, 4Z:
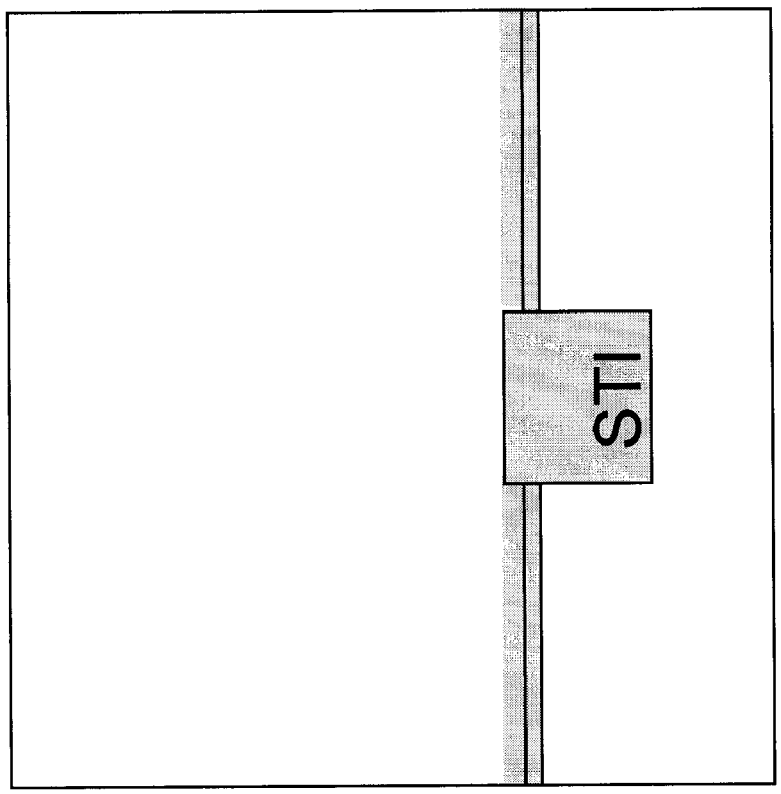
Figures 1, 4Z:
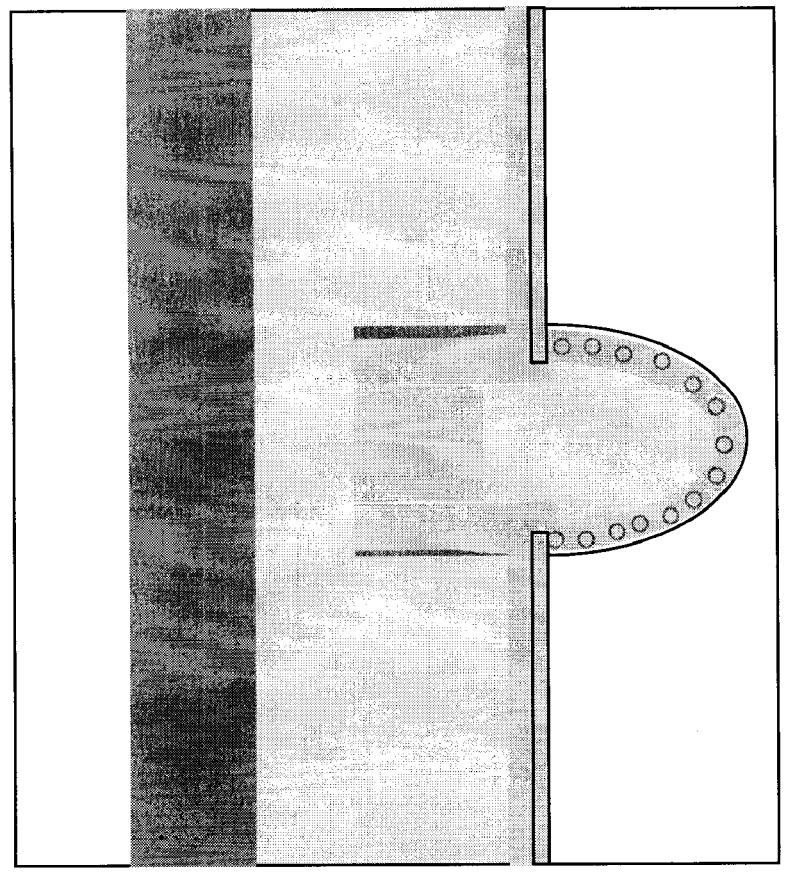

The structure is then subject to a lithographic etch using Photoresist and the like to etch the top gate 80. The resultant structure is shown in FIG. 4Z.

From the foregoing it can be seen that a high capacity non-volatile memory cell, and array, using trapping charge layer to store charges is disclosed. Further, a method of manufacturing the array is also disclosed. Finally various methods of programming such cell/array in which multi-bits can be stored in a single cell are also disclosed.

What is claimed is:

1. A non-volatile memory cell comprising:
   a substrate of a substantially single crystalline semiconductive material having a first conductivity type and a planar surface;
   a first trench in said substrate extending in a first direction, said first trench having a sidewall and a bottom;
   a first region of a second conductivity type in said bottom of said first trench;
   a second trench in said substrate extending in the first direction parallel to and spaced apart from the first trench by a section along the planar surface, said second trench having a sidewall and a bottom;

a second region of the second conductivity type in said bottom of said second trench;

a channel region connecting said first and second regions for the conduction of charges, said channel region having three portions: a first portion along the sidewall of the first trench, a second portion along the sidewall of the second trench; a third portion along the section between the first and second trenches, near the planar surface;

a first charge trapping layer spaced apart from the first portion of the channel region for trapping charges;

a second charge trapping layer spaced apart from the second portion of the channel region for trapping charges;

a dielectric layer spaced apart from the third portion of the channel region;

a first control gate in the first trench extending in the first direction, capacitively coupled to the first charge trapping layer and to the first region;

a second control gate in the second trench extending in the first direction, capacitively coupled to the second charge trapping layer and to the second region; and a third control gate couple to the dielectric layer for controlling the conduction of charges in the third portion of the channel region.

2. The cell of claim 1 wherein the third control gate extends in a second direction substantially perpendicular to the first direction.

3. The cell of claim 2 wherein said first and second charge trapping layer is a material made from Si-nc in SiN or silicon nitride or nanocrystal.

4. The cell of claim 1 wherein said substrate is single crystalline silicon.

5. An array of non-volatile memory cells comprising:

a substrate of a substantially single crystalline semiconductive material having a first conductivity type and a planar surface;

a plurality of spaced apart trenches in said substrate extending in a first direction, each trench separated from an adjacent trench by a section along the planar surface, with each trench having a sidewall and a bottom;

a plurality of non-volatile memory cells arranged in a plurality of rows and columns in said substrate, with the rows extending in the first direction and each row substantially perpendicular to each column; each of said non-volatile memory cell comprises:

a first trench having a first region of a second conductivity type in said bottom of said first trench;

a second trench, immediately adjacent to and spaced apart from the first trench, said second trench having a second region of the second conductivity type in said bottom of the second trench;

a channel region connecting the region along the bottom of the first trench to the region along the bottom of the second trench, for the conduction of charges, said channel region having three portions: a first portion along the sidewall of the first trench, a second portion along the sidewall of the second trench; a third portion along the section between the first trench and the second trench, near the planar surface;

a first charge trapping layer spaced apart from the first portion of the channel region for trapping charges;

a second charge trapping layer spaced apart from the second portion of the channel region for trapping charges;

a dielectric layer spaced apart from the third portion of the channel region;

a first control gate in the first trench extending in the row direction, capacitively coupled to the first charge trapping layer and to the first region;

a second control gate in the second trench extending in the row direction, capacitively coupled to the second charge trapping layer and to the second region;

a third control gate couple to the dielectric layer for controlling the conduction of charges in the third portion of the channel region, said third control gate extending in the column direction;

wherein non-volatile memory cells adjacent to one another in the row direction to one side share a common first control gate, and a common first region; and cells adjacent to one another in the row direction to another side share a common second control gate, and a common second region; and wherein non-volatile memory cells in the same column direction share a common third control gate.

6. The array of claim 5 wherein said first and second charge trapping layer is Si-nc in SiN.

7. The array of claim 6 wherein each of said first and second charge trapping layer is spaced apart from the substrate by a first insulating layer.

8. The array of claim 7 wherein the first and second control gates are spaced apart from the first and second charge trapping layers, respectively, by a second insulating layer.

9. The array of claim 8 wherein said first insulating layer is silicon dioxide.

10. The array of claim 9 wherein said second insulating layer is ONO.

11. A method of programming a non-volatile memory cell of the type having a substrate of a substantially single crystalline semiconductive material having a first conductivity type and a planar surface, with a first trench in said substrate extending in a first direction, said first trench having a sidewall and a bottom; a first region of a second conductivity type in said bottom of said first trench; a second trench in said substrate extending in the first direction parallel to and spaced apart from the first trench by a section along the planar surface, said second trench having a sidewall and a bottom; a second region of the second conductivity type in said bottom of said second trench; a channel region connecting said first and second regions for the conduction of charges, said channel region having three portions: a first portion along the sidewall of the first trench, a second portion along the sidewall of the second trench; a third portion along the section between the first and second trenches, near the planar surface; a first charge trapping layer spaced apart from the first portion of the channel region for trapping charges; a second charge trapping layer spaced apart from the second portion of the channel region for trapping charges; a dielectric layer spaced apart from the third portion of the channel region; a first control gate in the first trench extending in the first direction, capacitively coupled to the first charge trapping layer and to the first region; a second control gate in the second trench extending in the first direction, capacitively coupled to the second charge trapping layer and to the second region; and a third control gate couple to the dielectric layer for controlling the conduction of charges in the third portion of the channel region; wherein said method comprising:

applying a first voltage to the first region;

applying a second voltage to the first control gate; said second voltage sufficient to turn on the first portion of the channel region irrespective of the state of charge in the first charge trapping layer;

applying a third voltage to the third control gate, said third voltage sufficient to turn on the third portion of the channel region;

applying a fourth voltage to the second control gate, said fourth voltage greater than the second voltage;

applying a fifth voltage to the second region, said fifth voltage is greater than the first voltage and is sufficient to attract charges from the first region; wherein charges are injected to the second charge trapping layer near the planar surface from the channel region near the third portion;

applying a sixth voltage to the second region, said sixth voltage is greater than the first voltage and is sufficient to attract charges from the first region, and is less than the sixth voltage;

wherein charges are injected to the second charge trapping layer near the second region from the second portion of the channel region;

applying the first voltage to the second region;

applying the second voltage to the second control gate; said second voltage sufficient to turn on the second portion of the channel region irrespective of the state of charge in the second charge trapping layer;

applying the third voltage to the third control gate, said third voltage sufficient to turn on the third portion of the channel region;

applying the fourth voltage to the first control gate, said fourth voltage greater than the second voltage;

applying the fifth voltage to the first region, said fifth voltage is greater than the first voltage and is sufficient to attract charges from the second region; wherein charges are injected to the first charge trapping layer near the planar surface from the channel region near the third portion;

applying the sixth voltage to the first region, said sixth voltage is greater than the first voltage and is sufficient to attract charges from the second region, and is less than the sixth voltage; wherein charges are injected to the first charge trapping layer near the first region from the first portion of the channel region;

whereby four bits can be programmed into a single memory cell.

12. The method of claim 11 wherein charges are injected to the second charge trapping layer near the planar surface from the channel region near the third portion and charges are injected to the first charge trapping layer near the planar surface from the channel region near the third portion by the mechanism of source side injection.

13. The method of claim 11 wherein charges are injected to the second charge trapping layer near the second region from the second portion of the channel region and charges are injected to the first charge trapping layer near the first region from the first portion of the channel region by the mechanism of hot channel injection.

14. A method of programming a non-volatile memory cell of the type having a substrate of a substantially single crystalline semiconductive material having a first conductivity type and a planar surface, with a first trench in said substrate extending in a first direction, said first trench having a sidewall and a bottom; a first region of a second conductivity type in said bottom of said first trench; a second trench in said substrate extending in the first direction parallel to and spaced apart from the first trench by a section along the planar surface, said second trench having a sidewall and a bottom; a second region of the second conductivity type in said bottom of said second trench; a channel region connecting said first and second regions for the conduction of charges, said channel region having three portions: a first portion along the sidewall of the first trench, a second portion along the sidewall of the second trench; a third portion along the section between the first and second trenches, near the planar surface; a first charge trapping layer spaced apart from the first portion of the channel region for trapping charges; a second charge trapping layer spaced apart from the second portion of the channel region for trapping charges; a dielectric layer spaced apart from the third portion of the channel region; a first control gate in the first trench extending in the first direction, capacitively coupled to the first charge trapping layer and to the first region; a second control gate in the second trench extending in the first direction, capacitively coupled to the second charge trapping layer and to the second region; and a third control gate couple to the dielectric layer for controlling the conduction of charges in the third portion of the channel region; wherein said method comprising:

applying a first voltage to the first region;

applying a second voltage to the first control gate; said second voltage sufficient to turn on the first portion of the channel region irrespective of the state of charge in the first charge trapping layer;

applying a third voltage to the third control gate, said third voltage sufficient to turn on the third portion of the channel region;

applying a fourth voltage to the second control gate, said fourth voltage greater than the second voltage;

applying a fifth voltage to the second region, said fifth voltage is greater than the first voltage and is sufficient to attract charges from the first region; wherein charges are injected to the second charge trapping layer near the planar surface from the channel region near the third portion;

applying a sixth voltage to the second region, said sixth voltage is greater than the first voltage and is sufficient to attract charges from the first region, and is less than the sixth voltage;

wherein charges are injected to the second charge trapping layer near the second region from the second portion of the channel region;

applying the first voltage to the second region;

applying the second voltage to the second control gate; said second voltage sufficient to turn on the second portion of the channel region irrespective of the state of charge in the second charge trapping layer;

applying the third voltage to the third control gate, said third voltage sufficient to turn on the third portion of the channel region;

applying the fourth voltage to the first control gate, said fourth voltage greater than the second voltage;

applying the fifth voltage to the first region, said fifth voltage is greater than the first voltage and is sufficient to attract charges from the second region; wherein charges are injected to the first charge trapping layer near the planar surface from the channel region near the third portion;

applying the sixth voltage to the first region, said sixth voltage is greater than the first voltage and is sufficient to attract charges from the second region, and is less than the sixth voltage; wherein charges are injected to the first charge trapping layer near the first region from the first portion of the channel region;

whereby four bits can be programmed into a single memory cell.

* * * * *